United States Patent
Otoi et al.

(10) Patent No.: US 6,930,351 B2
(45) Date of Patent: Aug. 16, 2005

(54) SEMICONDUCTOR DEVICE WITH DUMMY GATE ELECTRODE

(75) Inventors: Hisakazu Otoi, Hyogo (JP); Hiromi Makimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/640,019

(22) Filed: Aug. 14, 2003

(65) Prior Publication Data

US 2005/0035397 A1 Feb. 17, 2005

(51) Int. Cl.[7] .................... H01L 29/788; H01L 29/00
(52) U.S. Cl. ................................. 257/316; 257/508
(58) Field of Search .............................. 257/316, 508

(56) References Cited

U.S. PATENT DOCUMENTS

| | | | | |
|---|---|---|---|---|
| 5,208,179 A | * | 5/1993 | Okazawa | 438/424 |
| 5,538,912 A | * | 7/1996 | Kunori et al. | 438/201 |
| 5,686,749 A | * | 11/1997 | Matsuo | 257/316 |
| 2004/0041202 A1 | * | 3/2004 | Kim et al. | 257/316 |

FOREIGN PATENT DOCUMENTS

JP  2001-284599  10/2001

* cited by examiner

*Primary Examiner*—Howard Weiss
(74) *Attorney, Agent, or Firm*—McDermott Will & Emery LLP

(57) ABSTRACT

A gate electrode, a drain region and a source region of a memory cell transistor are formed in an element forming region in a memory cell region. A gate electrode and source/drain regions of a transistor for peripheral circuitry are formed in an element forming region in a peripheral circuitry region. A dummy gate electrode is formed on an element isolation insulating film, and the position of each end of the dummy gate electrode and that of corresponding end of element isolation insulating film are different. An interlayer insulating film is formed on a semiconductor substrate to cover the gate electrode and the dummy electrode. Thus, a semiconductor device in which occurrence of crystal defects is suppressed can be obtained.

23 Claims, 23 Drawing Sheets

SEMICONDUCTOR DEVICE WITH DUMMY GATE ELECTRODE

BACKGROUND OF THE INVENTION

1. Field of the Invention

The present invention relates to a semiconductor device, and specifically, to a semiconductor device having an element isolation insulating film.

2. Description of the Background Art

In a semiconductor device, the surface of a semiconductor substrate is partitioned into a plurality of element forming regions by an element isolation insulating film. For example, in a semiconductor device with memory cells, the plurality of element forming regions may be separated mainly into a memory cell region, a peripheral circuitry region and the like. The memory cells are formed in the memory cell region, and the peripheral circuitry is formed in the peripheral circuitry region.

One example of such a conventional semiconductor device is described. As shown in FIG. 36, the surface of a semiconductor substrate 101 is partitioned into a memory cell region M and a peripheral circuitry region P. Prescribed P type well 107 and buried N type well 106 are formed on the surface of semiconductor substrate 101.

In memory cell region M, gate electrodes 132, 133 of a memory cell transistor are formed. In each of gate electrodes 132, 133, a floating gate electrode (polysilicon film 108) is formed on semiconductor substrate 101 with a silicon oxide film 102 interposed between them. A control gate electrode (polysilicon film 111) is formed on floating gate electrode 108 with an ONO film 109 interposed between them.

Further, drain regions 114a, 114b and a source region 115 of the memory cell transistor are formed on the surface of semiconductor substrate 101.

In peripheral circuitry region P, gate electrodes 134, 135 of a transistor for peripheral circuitry are formed. Further, source/drain regions 116, 117 of the transistor are formed on the surface of semiconductor substrate 101. A dummy gate electrode 131 is formed on an element isolation insulating film 105a. This dummy gate electrode 131 is formed simultaneously with gate electrodes 132, 133 134 and 135.

An interlayer insulating film 119 is formed on semiconductor substrate 101 so as to cover gate electrodes 132, 133 134 and 135, and dummy gate electrode 131. A conventional semiconductor device is structured as above.

The conventional semiconductor device above, however, involves a problem that a large number of crystal defects occur in a portion of semiconductor substrate 101 positioned close to element isolation insulating film 105a, and consequently a leakage current is increased. Accordingly, a desired operation can not be performed and the reliability of the semiconductor device is degraded.

SUMMARY OF THE INVENTION

The present invention is to solve the problem above, and an object of the present invention is to provide a semiconductor device in which occurrence of crystal defects is suppressed.

A semiconductor device according to a present invention includes an element isolation insulating film, a first element forming region, a second element forming region, a memory cell including a gate electrode, and a conductor portion. The element isolation insulating film is formed in a prescribed region of a main surface of a semiconductor substrate. The first element forming region is formed in a region at one side of the semiconductor substrate with reference to the element isolation insulating film. The second element forming region is formed in a region at the other side of the semiconductor substrate with reference to the element isolation insulating film. The memory cell including a gate electrode is formed in the first element forming region. The conductor portion is formed on the element isolation insulating film so as to overlap with the element isolation insulating film in a plane, and includes the same layer as the gate electrode. A first distance from a border of the first element forming region and the element isolation insulating film to one end of the conductor portion at the first element forming region side, and a second distance from a border of the second element forming region and the element isolation insulating film to the other end of the conductor portion at the second element forming region side are different.

According to this arrangement, since prescribed first distance and second distance are different, stress will not be centered to the portion of semiconductor substrate positioned close to the element isolation insulating film. As a result, the occurrence of crystal defects is suppressed therein, leading to the reduction of the occurrence of leakage current and the like resulted due to crystal defects. It should be noted that the conductor portion overlapping with the element isolation insulating film in a plane means that they are overlapping in the layout (two-dimensionally).

Another semiconductor device according to the present invention includes a first element isolation insulating film, a second element isolation insulating film, a third element isolation insulating film, an element forming region, a first electrode portion, a second electrode portion, and a prescribed plurality of impurity regions. The first element isolation insulating film and the second element isolation insulating film are each extending in one direction on a main surface of a semiconductor substrate and formed distanced from each other. The third element isolation insulating film is formed on the main surface of the semiconductor substrate, distanced from respective end of the first element isolation insulating film and the second element isolation insulating film at the one direction side, and extends in a direction crossing the one direction. The element forming region is formed on the main surface of the semiconductor substrate and partitioned by the first element isolation insulating film, the second element isolation insulating film and the third element isolation insulating film. The first electrode portion is formed to cross a main region positioned in a region sandwiched by the first element isolation insulating film and the second element isolation insulating film in the element forming region, and extends in a direction crossing the one direction. The second electrode portion is formed to cross the main region of the element forming region, in an opposing side to the third element isolation insulating film relative to the first electrode portion so as to be distanced therefrom, and extends in a direction crossing the one direction. The prescribed plurality of impurity regions are formed in a region except for the region to which the first electrode portion and the second electrode portion are positioned, in the main region of the element forming region.

According to this arrangement, the third element isolation insulating film is formed in one side to the main region in a region sandwiched by the first element isolation insulating film and the second element isolation insulating film so as to be distanced therefrom. Accordingly, no end is formed in the main region that is surrounded by the element isolation insulating films by three sides. As a result, stress resulting from the element isolation insulating film will not be centered to this portion, and hence the number of crystal defects are reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
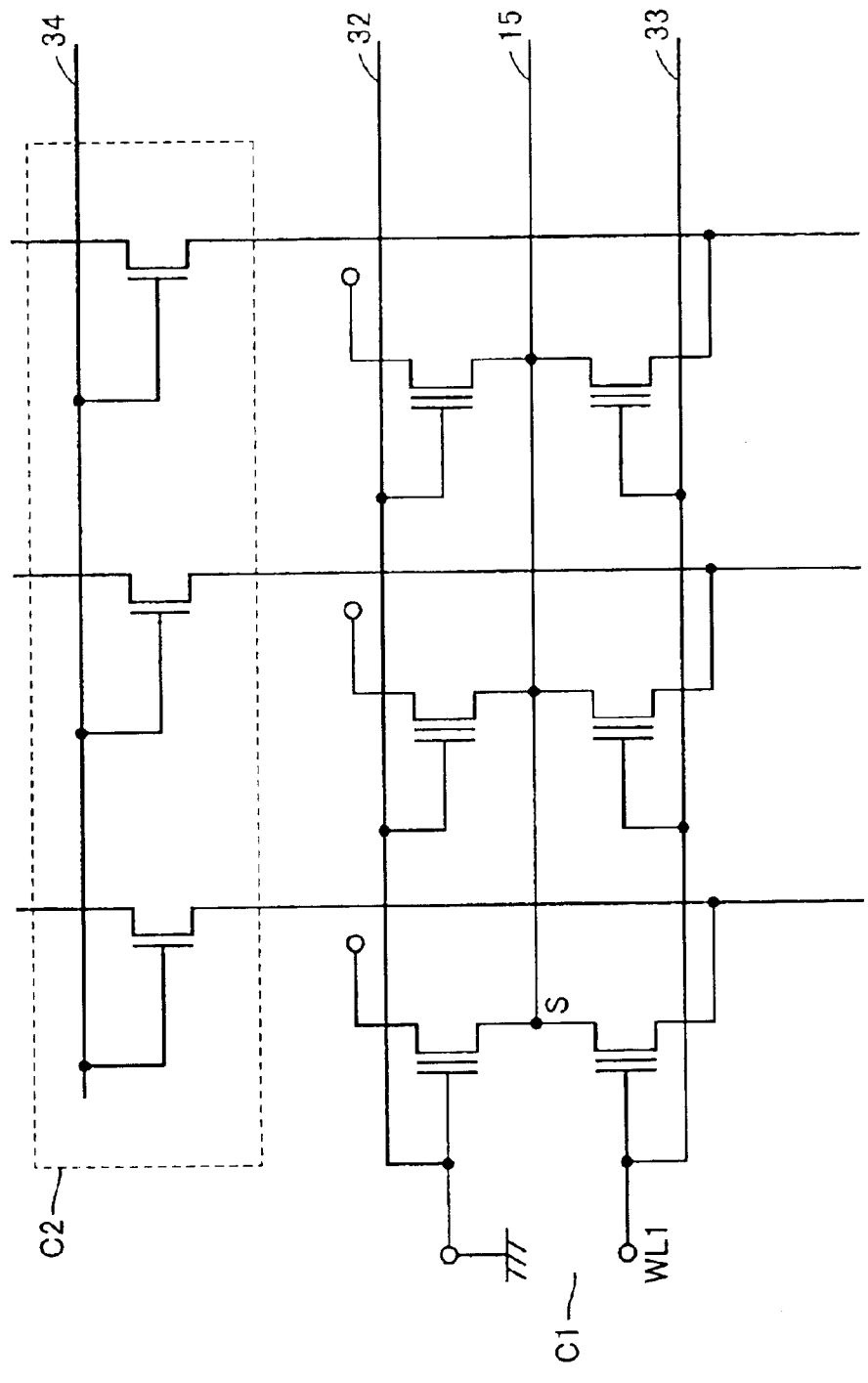
FIG. 1 is a diagram showing an equivalent circuit of a semiconductor device according to a first embodiment of the present invention.

As a semiconductor device according to a first embodiment of the present invention, one example of a semiconductor device with memory cells (flash memory) is described. As shown in FIG. 1, a semiconductor of this kind is formed with a memory cell C1 and peripheral circuitry C2.

Memory cell C1 is arranged in a prescribed memory cell region, and prescribed storage elements including a memory cell transistor are formed. Peripheral circuitry C2 is arranged in a prescribed peripheral circuitry region, and prescribed elements including, for example, a transistor are formed.

Gate electrodes 32, 33 of a prescribed memory cell transistor among a plurality of memory cell transistors formed in the memory cell region are each electrically connected via a prescribed word line, such as a word line WL1.

Among respective gate electrodes of the plurality of memory cell transistors, a gate electrode 32 that is closest to a dummy gate electrode 31, which will be described later, is specified as a dummy word line. In this semiconductor device, this gate electrode 32 is fixed to ground potential.

Figure 2:
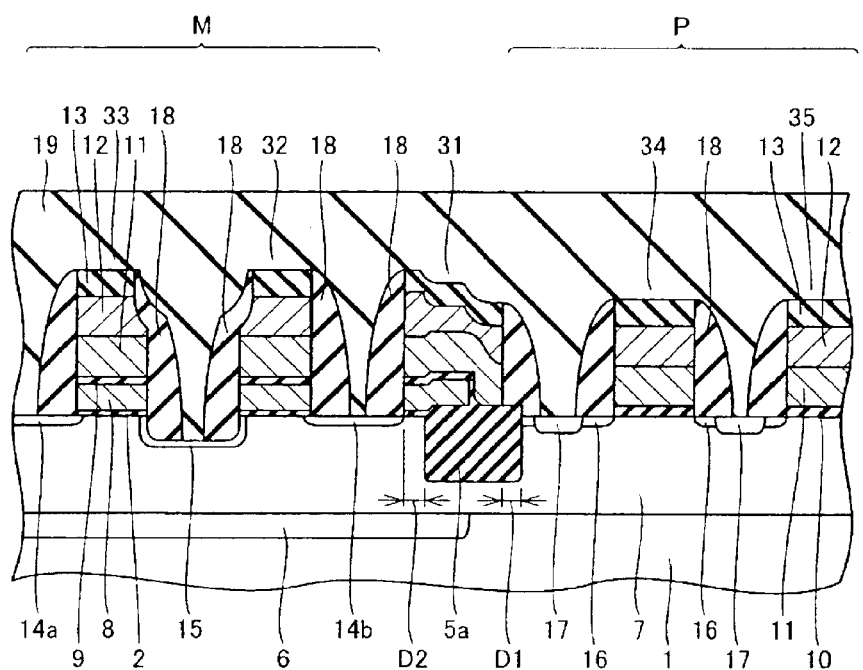
FIG. 2 is a cross sectional view of a semiconductor device through a section line II—II in FIG. 3 according to the first embodiment.
Figure 3:
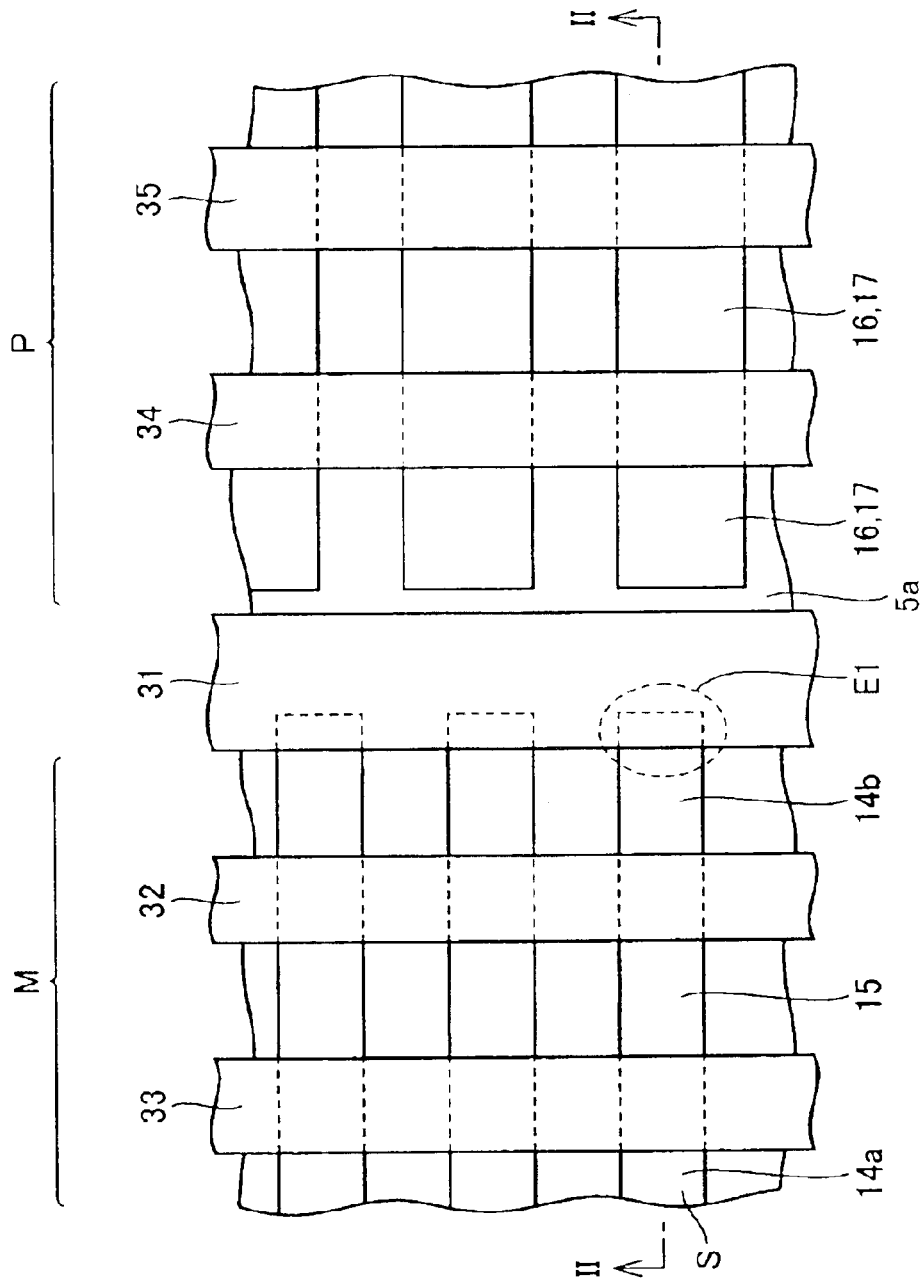
FIG. 3 is a plan view showing the semiconductor device according to the first embodiment.

Next, specific structure of the semiconductor device is described. As shown in FIGS. 2 and 3, the surface of a semiconductor element 1 is partitioned into a memory cell region M and a peripheral circuitry region P by an element isolation insulating film 5a. Prescribed P type well 7 and buried N type well 6 are formed on the surface of semiconductor substrate 1.

In an element forming region S in memory cell region M, gate electrodes 32, 33 of a memory cell transistor are formed. In each of gate electrodes 32, 33, a floating gate electrode (polysilicon film 8) is formed on semiconductor substrate 1 with a silicon oxide film 2 interposed between them.

A control gate electrode (polysilicon film 11) is formed on floating gate electrode 8 with an ONO film 9 interposed between them. Note that ONO film 9 is a multilayer film in which a silicon oxide film is formed on another silicon oxide film with a silicon nitride film interposed between them. On the surface of semiconductor substrate 1, drain regions 14a, 14b and a source region 15 of a memory cell transistor are formed.

In the element forming region in peripheral circuitry region P, gate electrodes 34, 35 of a transistor for periphery circuitry are formed. Source/drain regions 16, 17 of the transistor are formed on the surface of semiconductor substrate 1.

On element isolation insulating film 5a, as will be described later, dummy gate electrode 31 having a prescribed positional relationship with an end of element isolation insulating film 5a is formed. This dummy gate electrode 31 is formed simultaneously with gate electrodes 32, 33, 34, 35.

A sidewall oxide film 18 is formed on each side of gate electrodes 32, 33, 34, and 35, and dummy gate electrode 31. An interlayer insulating film 19 is formed on semiconductor substrate 1 so as to cover gate electrodes 32, 33, 34, and 35, and dummy gate electrode 31.

Figure 36:
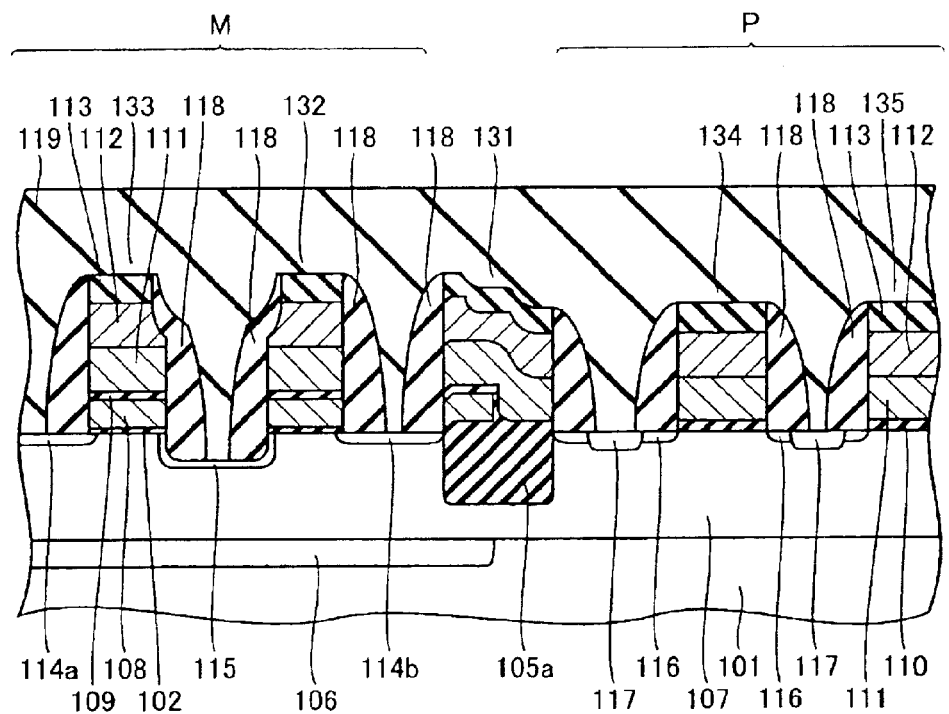
FIG. 36 is a cross-sectional view of a conventional semiconductor device.

As shown in FIG. 36, a conventional semiconductor device is formed so that the position of each end of dummy gate electrode 131 and the position of each end corresponding of element isolation insulating film 105a are matched. On the other hand, in the semiconductor device above, dummy gate electrode 31 and element isolation insulating film 5a are formed so that the position of each end of dummy gate electrode 31 and the position of each corresponding end of element isolation insulating film 5a are not matched.

Figure 4:
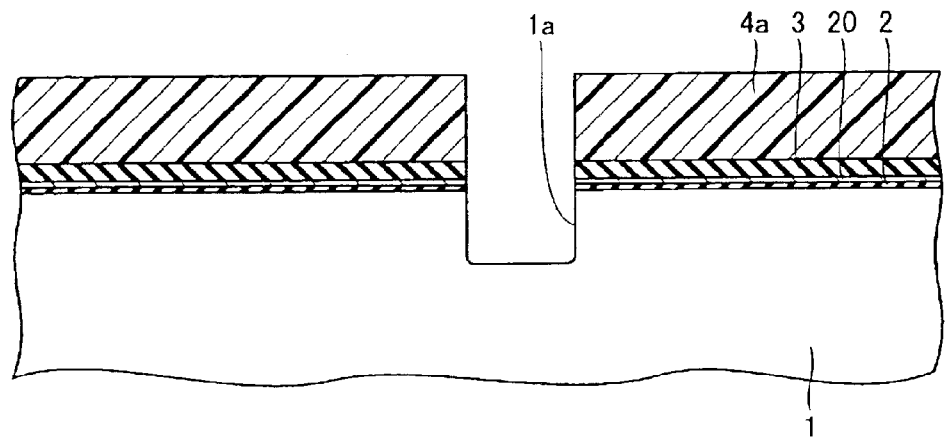
FIG. 4 is a cross-sectional view showing one step of a manufacturing method of the semiconductor device shown in FIG. 2 according to the first embodiment.

Next, one example of a manufacturing method of the semiconductor device above is described. As shown in FIG. 4, silicon oxide film 2 is formed on the main surface of semiconductor substrate 1 by a thermal oxidation method or the like. Polysilicon film 20 is formed on silicon oxide film 2 by a CVD (Chemical Vapor Deposition) method or the like.

On that polysilicon film 20, silicon nitride film 3 is formed by the CVD method or the like. On silicon nitride film 3, a prescribed photoresist pattern 4a is formed.

A trench 1a for forming an element isolation insulating film is formed using photoresist pattern 4a as a mask and performing a prescribed anisotropy etching sequentially on silicon nitride film 3, polysilicon film 20, silicon oxide film 2 and semiconductor substrate 1. Thereafter, photoresist pattern 4a is removed.

Figure 5:
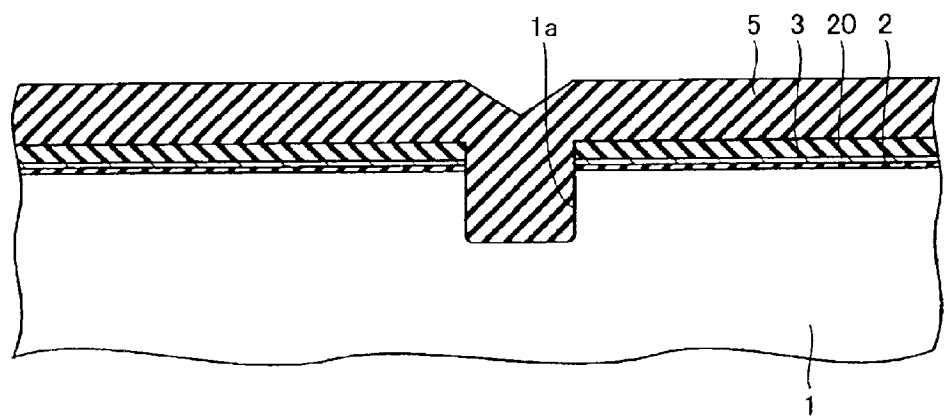
FIG. 5 is a cross-sectional view showing one step subsequent to the step of FIG. 4 according to the first embodiment.

Next, as shown in FIG. 5, silicon oxide film 5 is formed so as to fill trench 1a, by a thermal oxidation process on the exposed surface of semiconductor substrate 1 as well as by a high-density plasma method. Then, by performing CMP (Chemical Mechanical Polishing) process on silicon oxide film 5, silicon oxide film 5 positioned on silicon nitride film 3 is removed.

Figure 6:
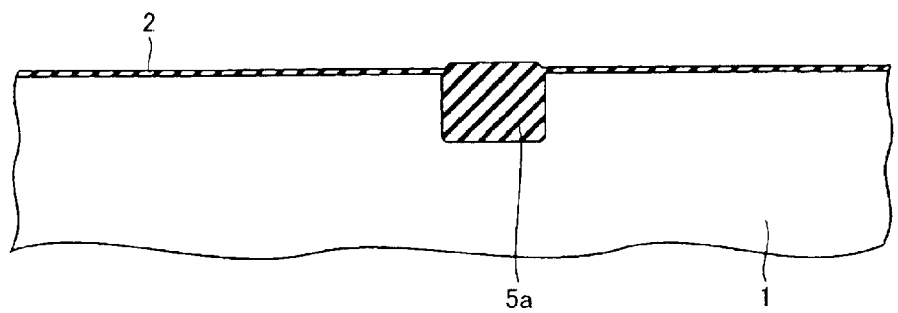
FIG. 6 is a cross-sectional view showing one step subsequent to the step of FIG. 5 according to the first embodiment.

Next, remaining silicon oxide film 5 is removed by a prescribed wet etching process. By performing the prescribed wet etching process further, silicon nitride film 3 is removed. By performing the prescribed wet etching process still further, polysilicon film 20 is removed, leaving silicon oxide film 5 in trench 1a. Thus, element isolation insulating film 5a is formed as shown in FIG. 6.

Figure 7:
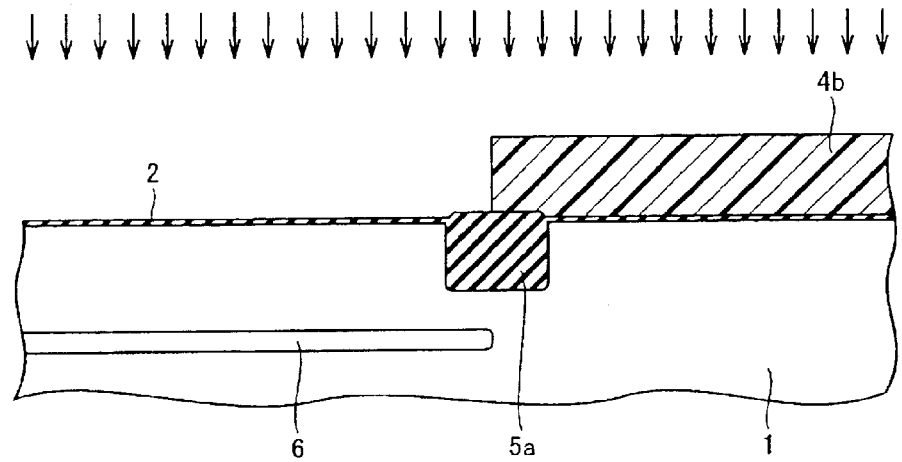
FIG. 7 is a cross-sectional view showing one step subsequent to the step of FIG. 6 according to the first embodiment.

Next, as shown in FIG. 7, a prescribed photoresist pattern 4b is formed. Buried N type well 6 is formed by implanting an N type impurity ion on the surface of semiconductor substrate 1 using this photoresist pattern 4b as a mask, and performing a thermal process. Thereafter, photoresist pattern 4b is removed.

Figure 8:
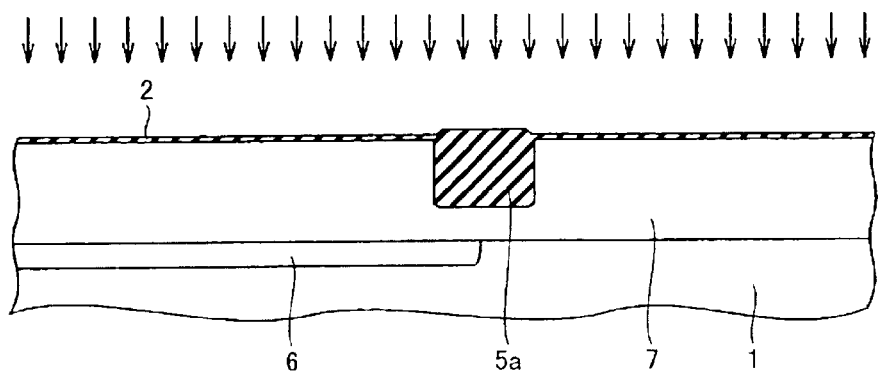
FIG. 8 is a cross-sectional view showing one step subsequent to the step of FIG. 7 according to the first embodiment.

Next, as shown in FIG. 8, buried N type well 7 is formed by implanting an N type impurity ion on the surface of semiconductor substrate 1 and performing a thermal process. Thereafter, by removing silicon oxide film 2 and performing a tunnel gate oxidation process, silicon oxide film (tunnel oxide film) 2 is again formed.

Figure 9:
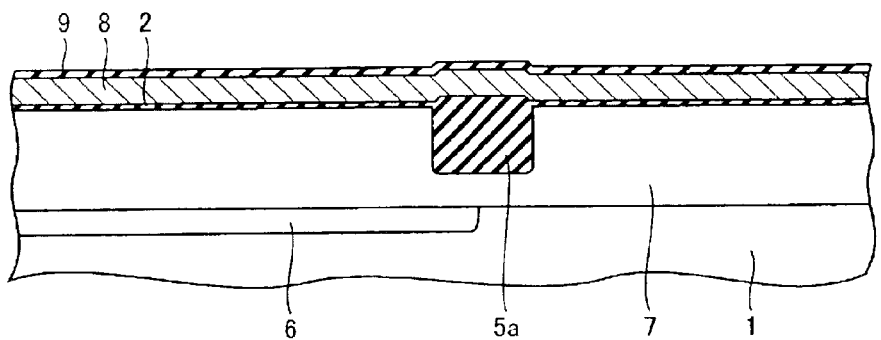
FIG. 9 is a cross-sectional view showing one step subsequent to the step of FIG. 8 according to the first embodiment.

Next, as shown in FIG. 9, polysilicon film 8 is formed on silicon oxide film 2 by the CVD method, for example. By performing an oxidation process on polysilicon film 8, a silicon oxide film is formed on the surface of polysilicon film 8. By forming another silicon oxide film on that silicon oxide film with a silicon nitride film interposed between them, ONO film 9 is formed.

Figure 10:
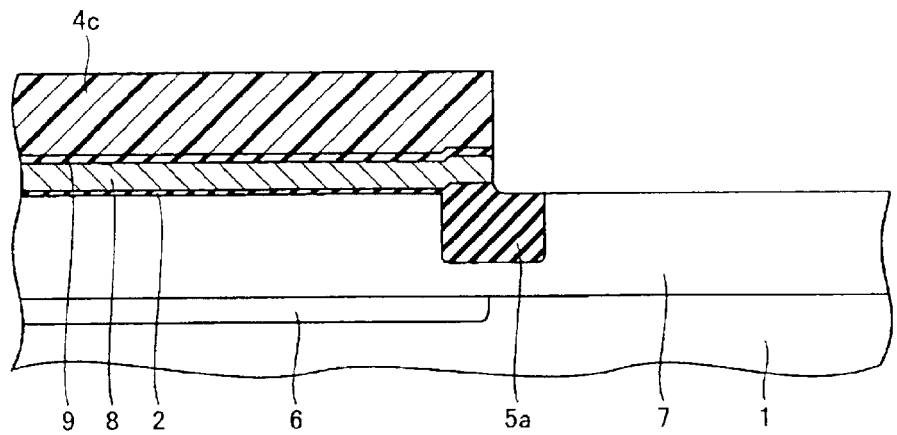
FIG. 10 is a cross-sectional view showing one step subsequent to the step of FIG. 9 according to the first embodiment.

Next, as shown in FIG. 10, a photoresist pattern 4c is formed on ONO film 9. An anisotropy etching is performed on ONO film 9 and polysilicon film 8 using this photoresist pattern 4c as a mask. Further, exposed tunnel oxide film 2 is removed. Thereafter, photoresist pattern 4c is removed.

Figure 11:
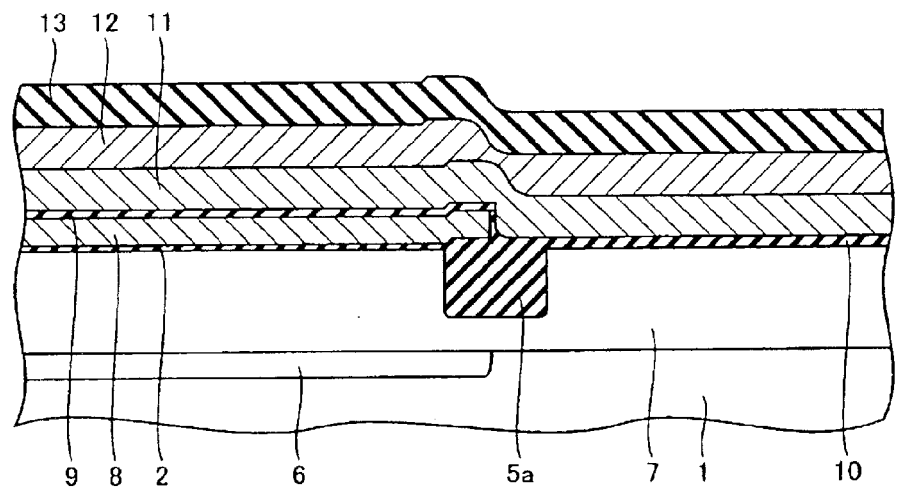
FIG. 11 is a cross-sectional view showing one step subsequent to the step of FIG. 10 according to the first embodiment.

Next, as shown in FIG. 11, a silicon oxide film (peripheral gate oxide film) 10 is formed in the peripheral region by a peripheral gate oxidation process. A polysilicon film 11 is formed on semiconductor substrate 1 by the CVD method or the like. A tungsten silicide film 12 is formed on this polysilicon film 11. A silicon oxide film 13 is formed on tungsten silicide film 12.

A photoresist pattern (not shown) is formed on silicon oxide film 13. An anisotropy etching is performed on silicon oxide film 13 using this photoresist pattern as a mask, and thus silicon oxide film 13 is patterned. Thereafter, this photoresist pattern is removed.

Figure 12:
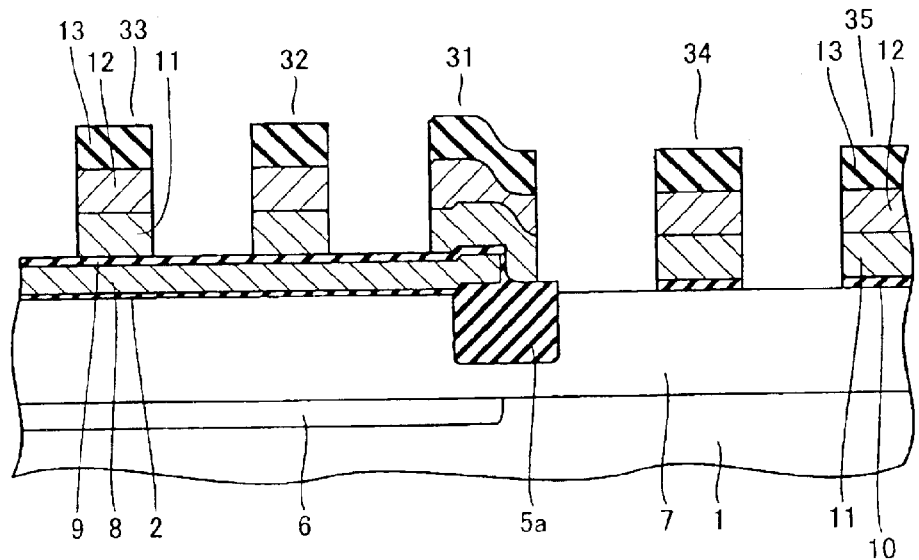
FIG. 12 is a cross-sectional view showing one step subsequent to the step of FIG. 11 according to the first embodiment.

Next, as shown in FIG. 12, an anisotropy etching is performed on tungsten silicide film 12 and doped amorphous silicon film 11 using thus patterned silicon oxide film 13 as a mask. Thereafter, an N-type source/drain region 16 (see FIG. 13) is formed in the peripheral region by a prescribed ion implanting process.

Figure 13:
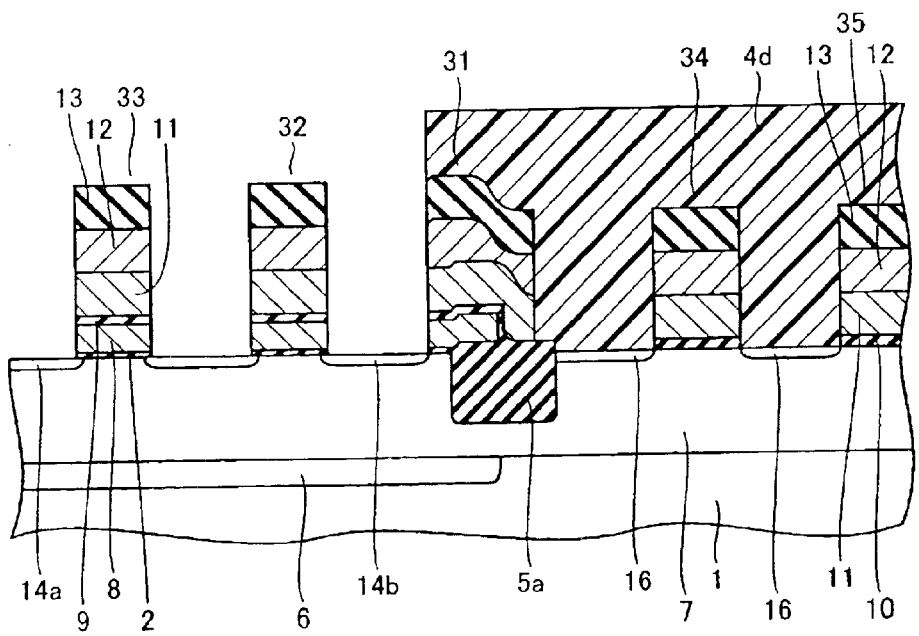
FIG. 13 is a cross-sectional view showing one step subsequent to the step of FIG. 12 according to the first embodiment.

Next, as shown in FIG. 13, a photoresist pattern 4d is formed. An anisotropy etching is performed on ONO film 9 and polysilicon film 8 using photoresist pattern 4d and patterned silicon oxide film 13 as masks. Thereafter, drain regions 14a and 14b are formed in the element forming region in memory cell region M by a prescribed ion implanting process. Thereafter, resist pattern 4d is removed.

Figure 14:
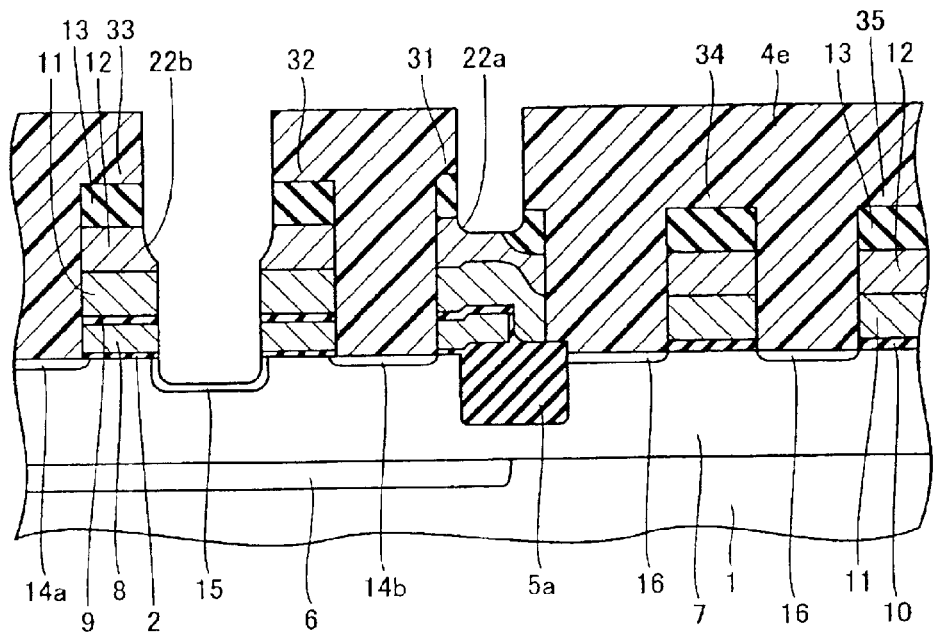
FIG. 14 is a cross-sectional view showing one step subsequent to the step of FIG. 13 according to the first embodiment.

Next, as shown in FIG. 14, a photoresist pattern 4e is formed. Exposed semiconductor substrate 1 is etched using photoresist pattern 4e as a mask. Next, by a prescribed ion implanting process, source region 15 is formed in memory cell region M. Thereafter, photoresist pattern 4e is removed.

Thus, gate electrodes 32, 33 of the memory cell transistor are formed in memory cell region M, and gate electrodes 34, 35 of the peripheral circuitry transistor are formed in peripheral circuitry region P. A prescribed dummy gate electrode is formed on element isolation insulating film 5a.

Thereafter, a TEOS (Tetra Ethyl Ortho Silicate glass) film (not shown) is formed so as to cover these gate electrodes 32–35 and others. By performing a dry etching process on the TEOS film, a sidewall oxide film 18 is formed.

Figure 15:
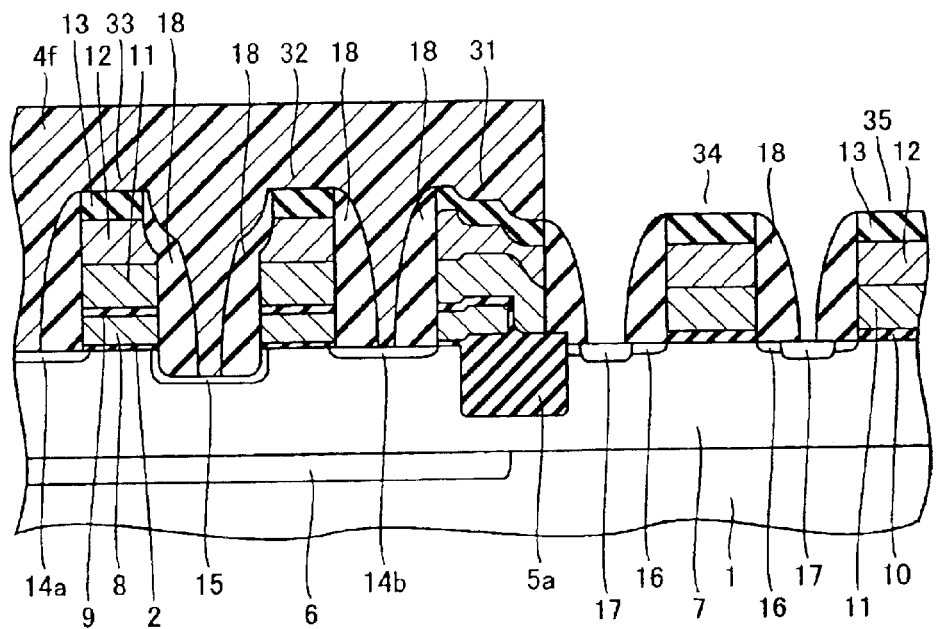
FIG. 15 is a cross-sectional view showing one step subsequent to the step of FIG. 14 according to the first embodiment.

Next, as shown in FIG. 15, a photoresist pattern 4f is formed. An N+ type source/drain region 17 is formed in peripheral circuitry region P by performing a prescribed ion implanting process using this photoresist pattern 4f as a mask. Thereafter, photoresist pattern 4f is removed.

Next, an interlayer oxide film 19 including TEOS film and BPTEOS (Boro Phospho Tetra Ethyl Ortho Silicate glass) film is formed so as to cover gate electrodes 32–35 and others, completing a semiconductor device shown in FIG. 2.

In the semiconductor device above, specifically, the end of dummy gate electrode 31 at memory cell region M side is positioned closer to memory cell region M than the corresponding end of element isolation insulating film 5a is (on the element forming region in memory cell region M), and the end thereof at peripheral circuitry region P is positioned closer to memory cell region M than the corresponding end of element isolation insulating film 5a is (on element isolation insulating film 5a).

Each of the gate electrodes is faced to semiconductor substrate 1 with gate insulating film 2 interposed between them. Accordingly, the stress with the gate electrode easily affects memory cell region and others, increasing the possibility of the occurrence of crystal defects in the memory cell region and others.

By forming dummy gate electrode 31 specifically as described above, the crystal defects occurring in the portion of semiconductor substrate 1 positioned close to element isolation insulating film 5a largely decreases as compared to a conventional semiconductor device. This will be described in detail below.

First, as shown in FIG. 2, the number of crystal defects was evaluated by changing distances D1, D2 between an end of dummy gate electrode 31 and the corresponding end of element isolation insulating film 5a. It turned out that the number of crystal defects is decreased depending on distance D1 between one end of dummy gate electrode 31 and a corresponding end of element isolation insulating film 5a, specifically when one end of dummy gate electrode 31 is positioned on element isolation insulating film 5a.

Figure 16:
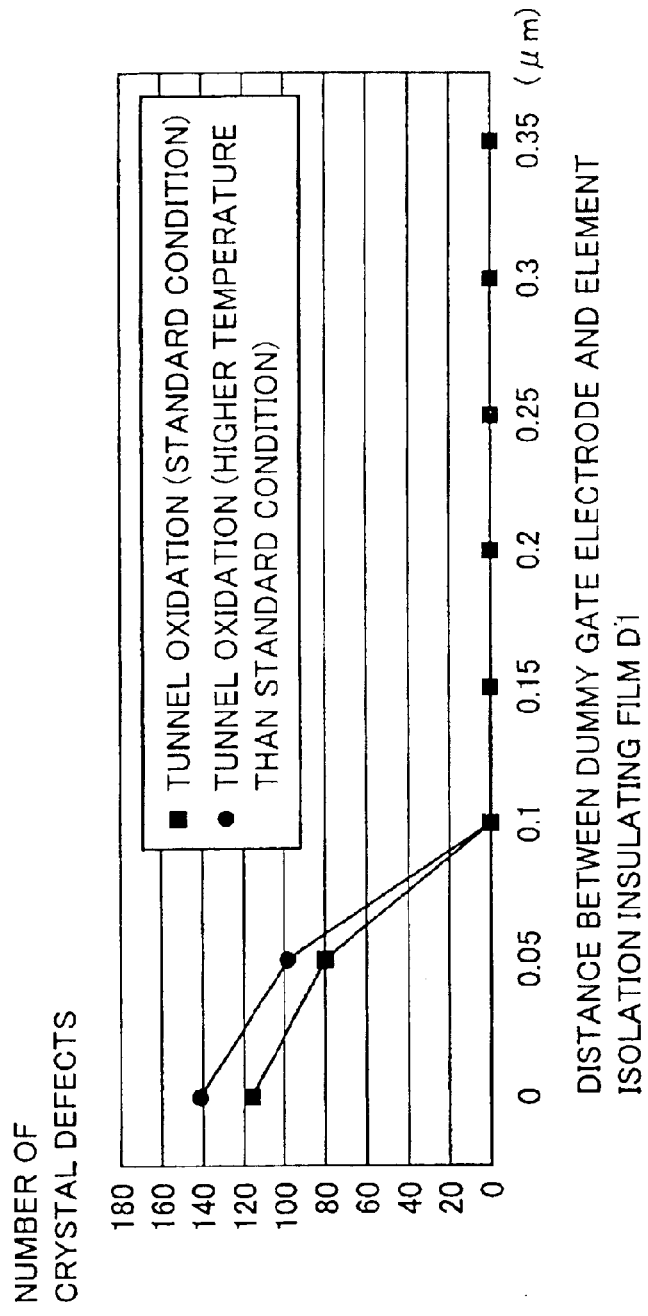
FIG. 16 shows the dependency of the number of crystal defects on the distance between a dummy gate electrode and an element isolation insulating film according to the first embodiment.

The result is shown in FIG. 16. The abscissas in FIG. 16 indicates distance D1 between an end of dummy gate electrode 31 at peripheral circuitry region P side and an corresponding end of element isolation insulating film 5a shown in FIG. 2, and the ordinate indicates the number of crystal defects. After forming an interlayer oxide film, the number of crystal defects in a sample prepared under an tunnel oxidation condition of a standard condition, and in a sample prepared under a higher temperature condition than the standard condition was counted by an observation with SEM (Scanning Electron Microscope).

As shown in FIG. 16, when distance D1 is 0 $\mu$m, i.e., the structure corresponding to a conventional semiconductor device, the number of crystal defects is recognized 100 or more. On the other hand, the number of crystal defects decreases as distance D1 increases, and almost no crystal defect can be found when distance D1 is at least 0.1 $\mu$m.

Although FIG. 16 shows the result of observation for the central portion of a wafer, the similar result is also obtained for the peripheral portion of the wafer. Additionally, it turned out that the similar tendency is recognized when other end of dummy gate electrode 31 (the end at the memory cell region side) is positioned on element isolation insulating film 5a.

As for distance D2 between the end of dummy gate electrode 31 at the memory cell region side and the corresponding end of element isolation insulating film 5a, no dependency of the number of crystal defect thereon, such as the dependency on distance D1, is recognized. However, it is recognized that the number of crystal defects is decreased by keeping distance D2.

It has been found that, except for the case where one end of dummy gate electrode 31 is positioned on the element forming region in memory cell region M, the similar tendency is also recognized in a case where other end of dummy gate electrode 31 is positioned on the element forming region in peripheral circuitry region P.

The reason for such a decrease in the number of crystal defect can be considered as follows. First, in the semiconductor device above, each of gate electrodes 32, 33 of memory cell region M, including dummy gate electrode 31, is a two-layer structure gate electrode where polysilicon film 11 is formed on another polysilicon film 8 with ONO film 9 interposed between them.

Therefore, the height of the two-layer structure gate electrode becomes higher than one-layer structure gate electrode, which will be, for example, approximately 0.1–0.5 $\mu$m. Hence, a stress resulting from the shrinking force of gate electrode will act on the portion of the semiconductor substrate positioned immediately under opposing sides of the gate electrode.

Generally, when the thickness of polysilicon film of the gate electrode is approximately 0.2 $\mu$m, for example, it is assumed that the stress of approximately $7 \times 10^9$ dynes/cm$^2$ will act on the portion of the semiconductor substrate, and when it is approximately 0.3 $\mu$m, the stress of approximately $1 \times 10^{10}$ dynes/cm$^2$ will act thereon.

On the isolation region where element isolation insulating film 5a is formed, relatively high stress acts on semiconductor substrate 1 due to such a two-layer structure dummy gate electrode 31, and also the stress resulting from element isolation insulating film 5a acts thereon.

The above described semiconductor device is different from a conventional semiconductor device in that the position of each end of dummy gate electrode 31 does not match with the position of corresponding end of element isolation insulating film 5a. Accordingly, the stress will not be centered to the portion of semiconductor substrate 1 positioned close to element isolation insulating film 5a, leading to the reduction in the number of crystal defects therein.

Further, in the present semiconductor device, the end of element forming region S of memory cell region M is surrounded by element isolation insulating film 5a by three sides as indicated by dot frame E1 in FIG. 3. The stress resulting from element isolation insulating film 5a tends to act on such an end.

To element forming region S, as shown in FIG. 13, source region 14b and others are formed by an ion implanting process using dummy electrode 31 and others as masks. At this time, by forming dummy gate electrode 31 to cover the end, the end portion can also be protected from the damage caused by the ion implantation.

Thus, in the present semiconductor device (flash memory), since the number of crystal defects is reduced and the occurrence of the leakage current is suppressed, the reliability of the semiconductor memory improves.

Further, by fixing the control electrode of gate electrode 32 as a dummy word line to GND potential, the transistor including the gate electrode 32 will not turn on.

Therefore, the end of the element forming region that is surrounded by element isolation insulating film 5a at three sides and the portion of element forming region where large number of memory cell transistors are formed except for that end can be insulated electrically.

As a result, even when the stress is centered to the end due to its position being surrounded by the element isolation insulating film at three sides and crystal defects occur therein, the current leakage through the crystal defects is suppressed, and desired function is attained without each memory cell transistor short-circuiting with each other.

Second Embodiment

In the above described semiconductor device, the case in which the end of dummy gate electrode 31 at memory cell region M side is positioned closer to memory cell region M than the corresponding end of element isolation insulating film 5a is, and the end thereof at peripheral circuitry region P side is positioned closer to memory cell region M (on element isolation insulating film 5a) than the corresponding end of element isolation insulating film 5a is has been described as an example.

Now, a case in which the end of dummy gate electrode 31 at memory cell region M side is positioned closer to peripheral circuitry region P (on element isolation insulating film 5a) than the corresponding end of element isolation insulating film 5a is, and the end thereof at peripheral circuitry region P side is positioned closer to peripheral circuitry region P (on element forming region in peripheral circuitry region P) than the corresponding end of element isolation insulating film 5a is will be described.

Figure 17:
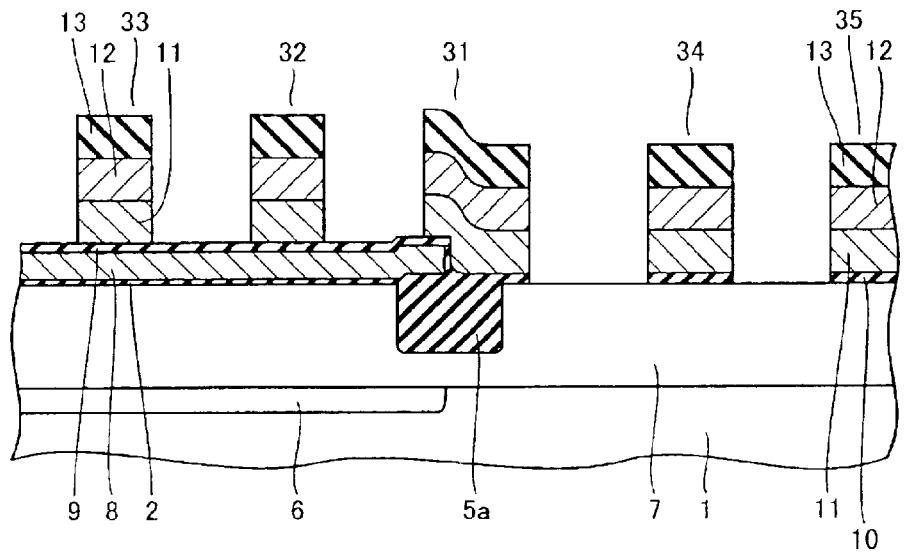
FIG. 17 is a cross-sectional view showing one step of a manufacturing method of a semiconductor device according to a second embodiment of the present invention.

First, the manufacturing method thereof is described. Following the steps shown in FIGS. 4–11, as shown in FIG. 17, an anisotropy etching is performed using a prescribed silicon oxide film 13 as a mask, which includes a portion patterned so that each end of dummy gate electrode 31 and each end of element isolation insulating film 5a have the above described positional relationship.

Thus, dummy gate electrode 31 is formed, together with gate electrodes 32, 33 of memory cell transistor, and gate electrodes 34, 35 of the transistor for peripheral circuitry.

Figure 18:
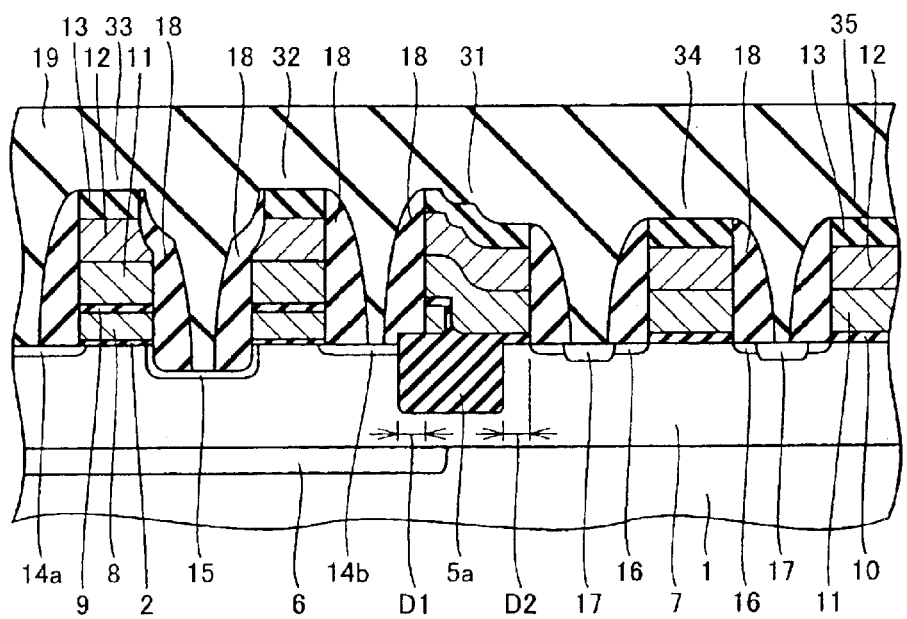
FIG. 18 is a cross-sectional view of the semiconductor device through a section line XVIII—XVIII in FIG. 19 according to the second embodiment.
Figure 19:
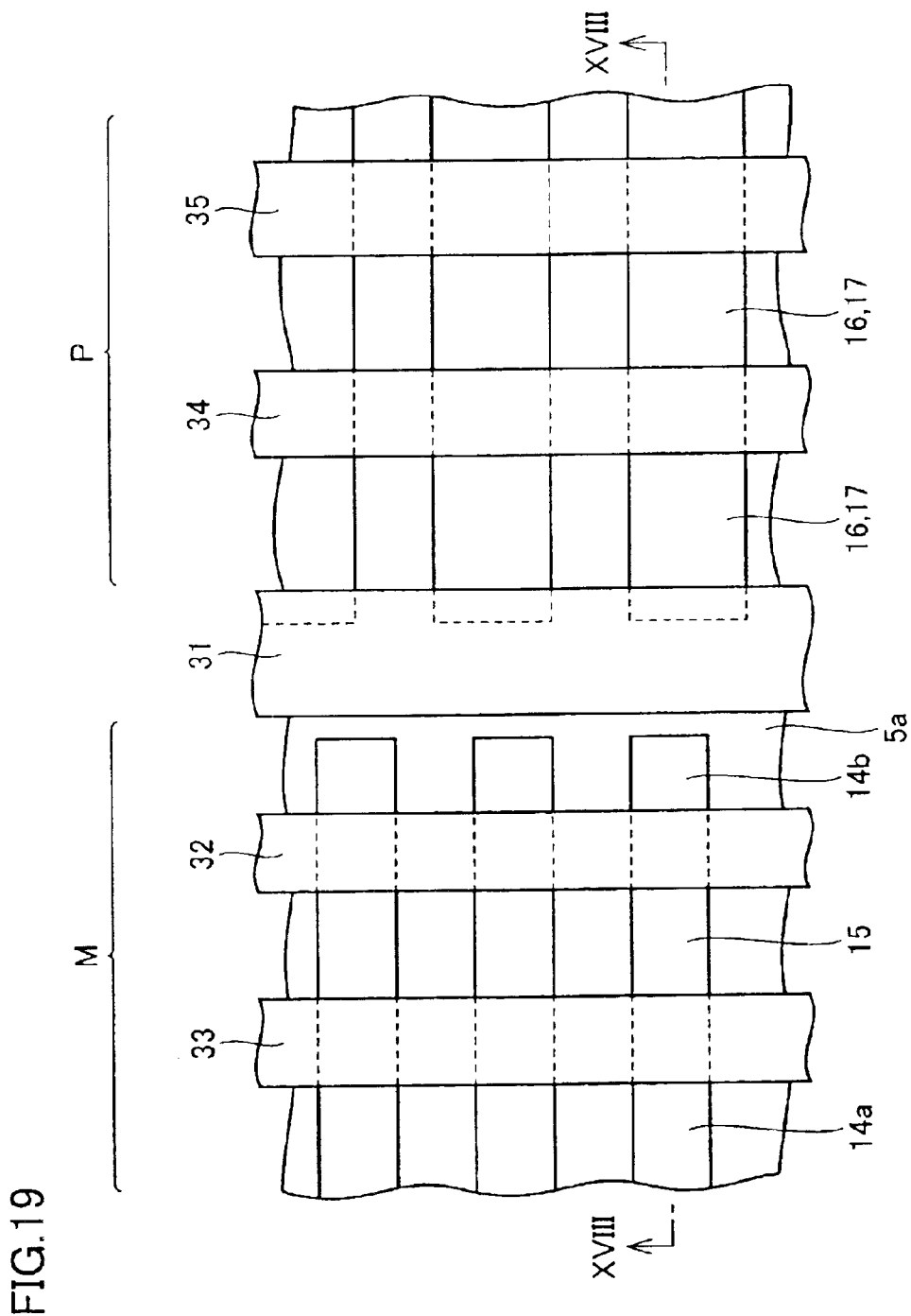
FIG. 19 is a plan view of the semiconductor device according to the second embodiment.

Thereafter, through steps similar to those shown in FIGS. 13–15, the semiconductor shown in FIGS. 18 and 19 is completed.

In the semiconductor device described above, distance D1 between the end of dummy gate electrode 31 at memory cell region M side and the corresponding end of element isolation insulating film 5a is preferably set to at least 0.1 μm. Additionally, the end thereof at peripheral circuitry region P side and the corresponding end of element isolation insulating film 5a are separated by distance D2.

Thus, as mentioned above, the stress will not be centered to the portion of semiconductor substrate 1 positioned close to element isolation insulating film 5a and the number of crystal defects therein decreases. As a result, the occurrence of the leakage current is suppressed as well, improving the reliability of the semiconductor device (flash memory).

Third Embodiment

Now, a case where the end of dummy gate electrode 31 at memory cell M side and the end thereof at peripheral circuitry region P side are both positioned on element isolation insulating film 5a is described.

Figure 20:
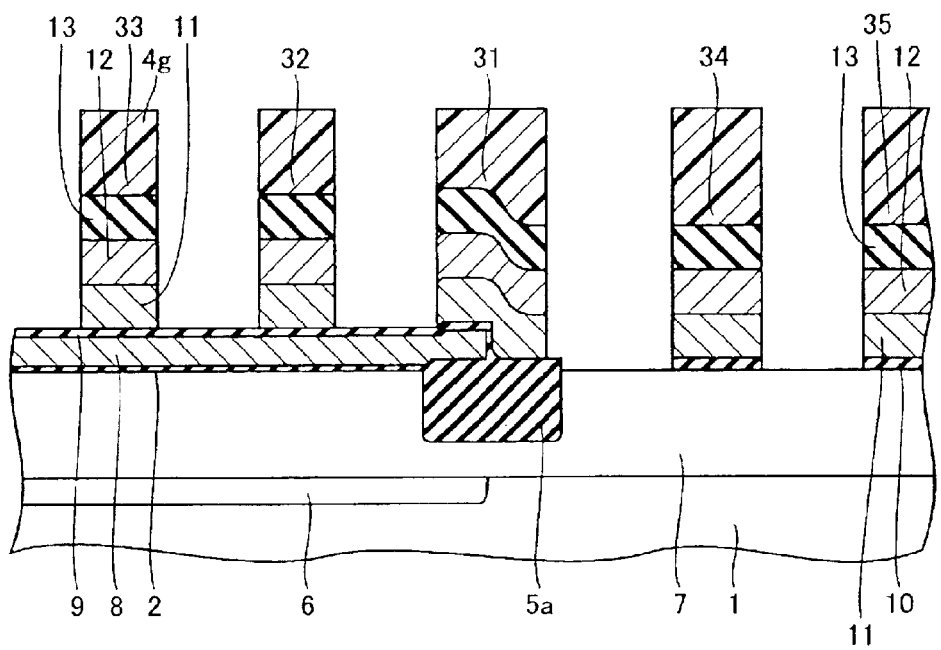
FIG. 20 is a cross-sectional view showing one step of a manufacturing method of a semiconductor device according to a third embodiment of the present invention.

First, the manufacturing method thereof is described. Following the steps of FIGS. 4–11, as shown in FIG. 20, an anisotropy etching is performed using a prescribed silicon oxide film 13 as a mask, which includes the portion patterned so that each end of dummy gate electrode 31 and each end of element isolation insulating film 5a have the above described positional relationship.

Thus, dummy gate electrode 31 is formed, together with gate electrodes 32, 33 of memory cell transistor, and gate electrodes 34, 35 of the transistor for peripheral circuitry.

Figure 21:
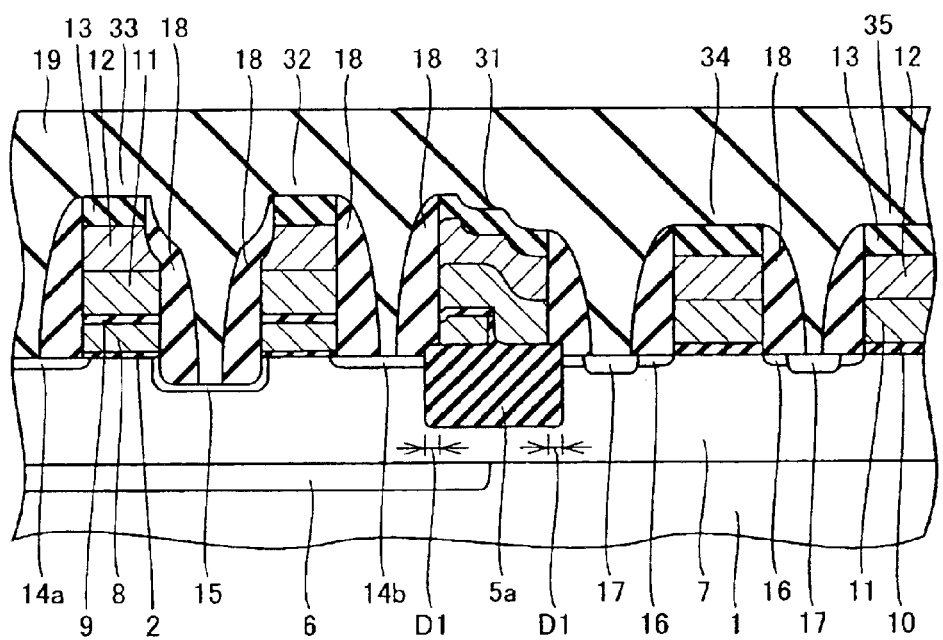
FIG. 21 is a cross-sectional view of the semiconductor device through a section line XXI—XXI in FIG. 22 according to the third embodiment.
Figure 22:
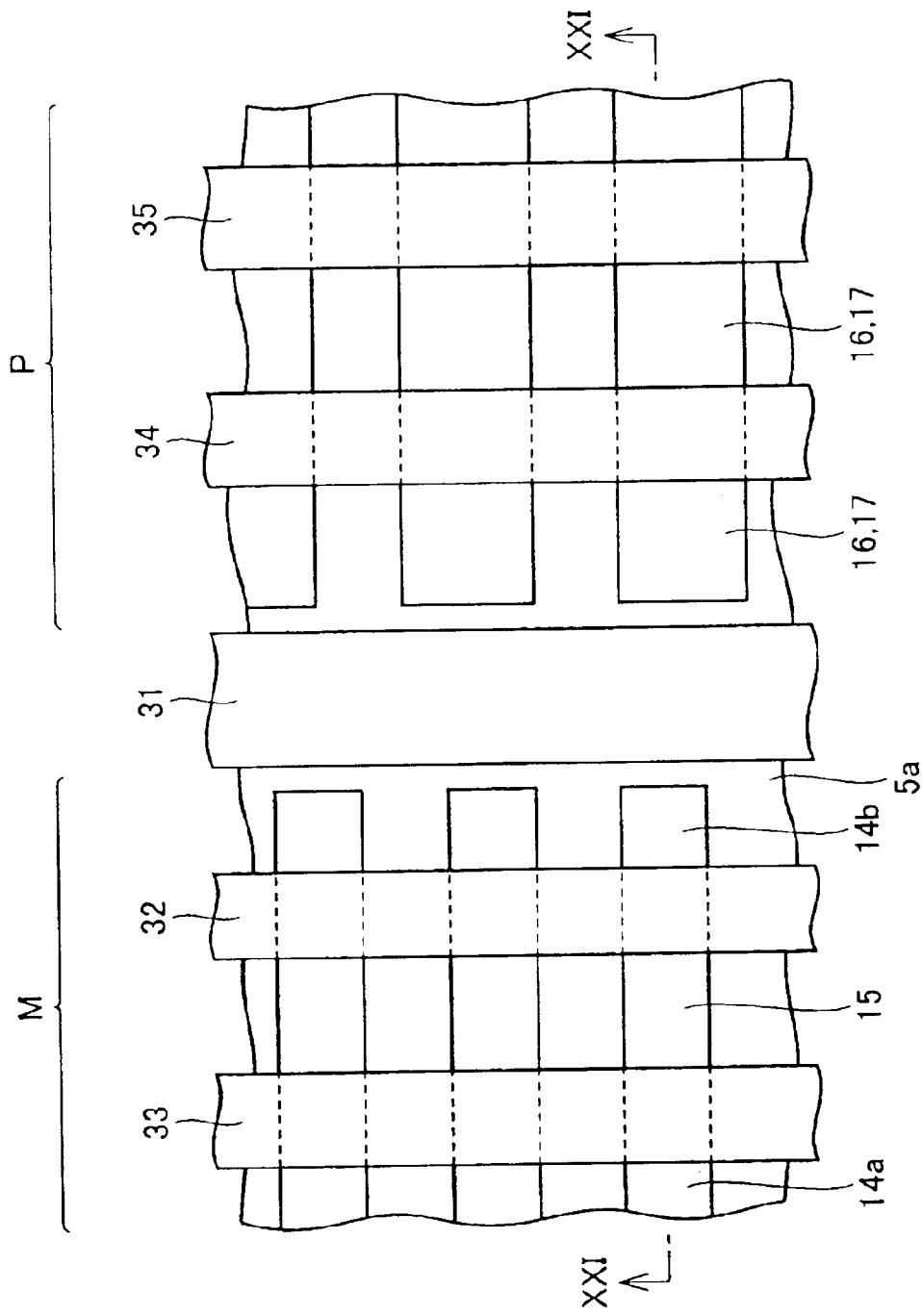
FIG. 22 is a plan view of the semiconductor device according to the third embodiment.

Thereafter, through steps similar to those shown in FIGS. 13–15, the semiconductor shown in FIGS. 21 and 22 is completed.

In the semiconductor device described above, distance D1 between the end of dummy gate electrode 31 at memory cell region M side and the corresponding end of element isolation insulating film 5a, and distance D2 between the end thereof at peripheral circuitry region P side and the corresponding end of element isolation insulating film 5a are preferably set to at least 0.1 μm.

Thus, as above, the stress will not be centered to the portion of semiconductor substrate 1 positioned close to element isolation insulating film 5a and the number of crystal defects therein decreases. As a result, the occurrence of the leakage current is suppressed as well, improving the reliability of the semiconductor device (flash memory).

Fourth Embodiment

Now, a case where the end of dummy gate electrode 31 at memory cell M side is positioned on the element forming region in memory cell region M, and the end thereof at peripheral circuitry region P side is positioned on the element forming region in peripheral circuitry region P is described.

Figure 23:
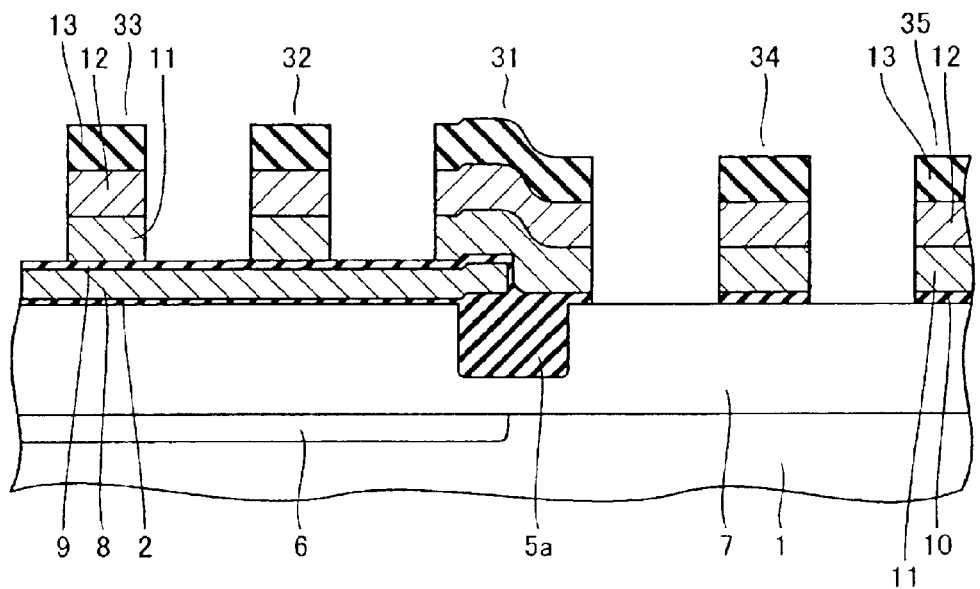
FIG. 23 is a cross-sectional view showing one step of a manufacturing method of a semiconductor device according to a fourth embodiment of the present invention.

First, the manufacturing method thereof is described. Following the steps of FIGS. 4–11, as shown in FIG. 23, an anisotropy etching is performed using a prescribed silicon oxide film 13 as a mask, which includes the portion patterned so that each end of dummy gate electrode 31 and each end of element isolation insulating film 5a have the above described positional relationship.

Thus, dummy gate electrode 31 is formed, together with gate electrodes 32, 33 of memory cell transistor, and gate electrodes 34, 35 of the transistor for peripheral circuitry.

Figure 24:
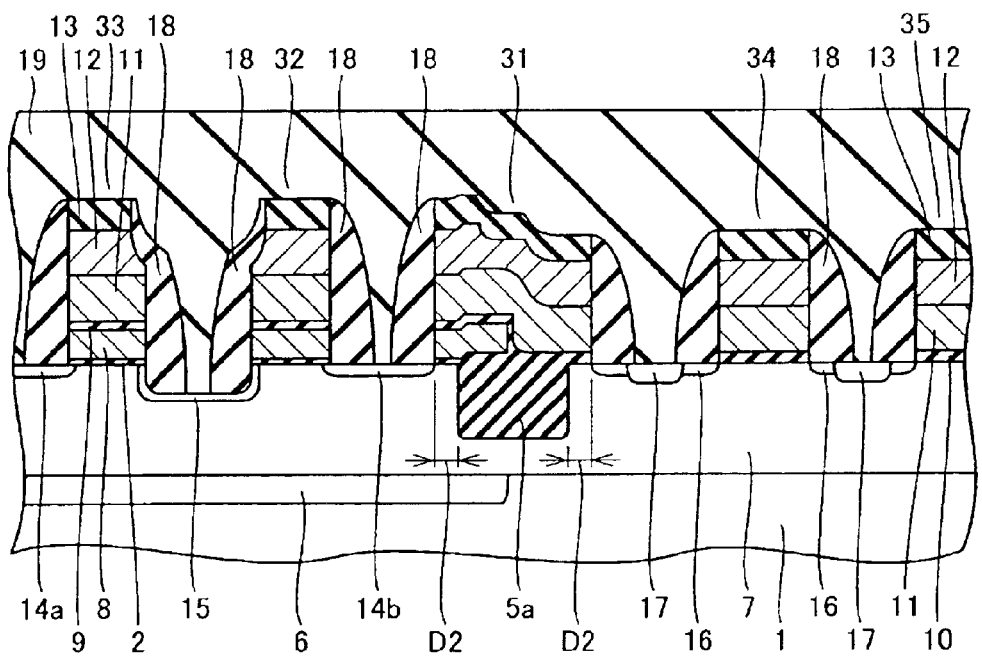
FIG. 24 is a cross-sectional view of the semiconductor device through a section line XXIV—XXIV in FIG. 25 according to the fourth embodiment.
Figure 25:
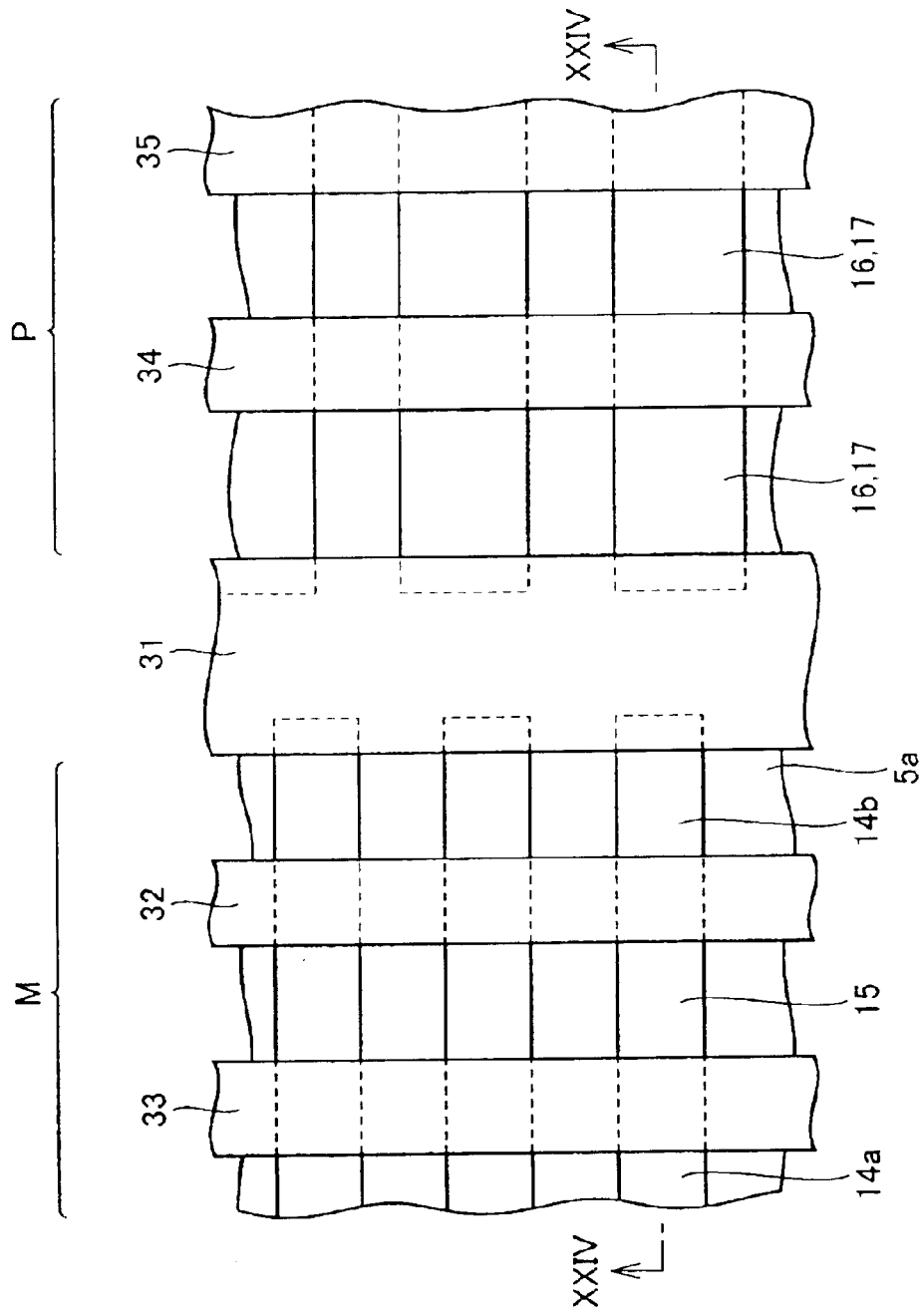
FIG. 25 is a plan view of the semiconductor device according to the fourth embodiment.

Thereafter, through steps similar to those shown in FIGS. 13–15, the semiconductor shown in FIGS. 24 and 25 is completed.

In the semiconductor device described above, the end of dummy gate electrode 31 at memory cell region M side and the corresponding end of element isolation insulating film 5a is separated by distance D2, and the end thereof at peripheral circuitry region P side and the corresponding end of element isolation insulating film 5a is separated by distance D2.

Thus, as above, the stress will not be centered to the portion of semiconductor substrate 1 positioned close to element isolation insulating film 5a and the number of crystal defects therein decreases. As a result, the occurrence of the leakage current is suppressed as well, improving the reliability of the semiconductor device (flash memory).

Fifth Embodiment

Now, a modification of the case (the first embodiment) in which the end of dummy gate electrode 31 at memory cell region M side is positioned closer to memory cell region M (on element forming region in memory cell region M) than the corresponding end of element isolation insulating film 5a is, and the end thereof at peripheral circuitry region side is positioned closer to memory cell region M (on element isolation insulating film 5a) than the corresponding end of element isolation insulating film 5a is, will be described.

In the semiconductor device shown in FIG. 3 (or in FIG. 2), the end of element forming region S in memory cell region M is formed surrounded by element isolation insulating film 5a at three sides, as indicated in dot frame E1.

Figure 26:
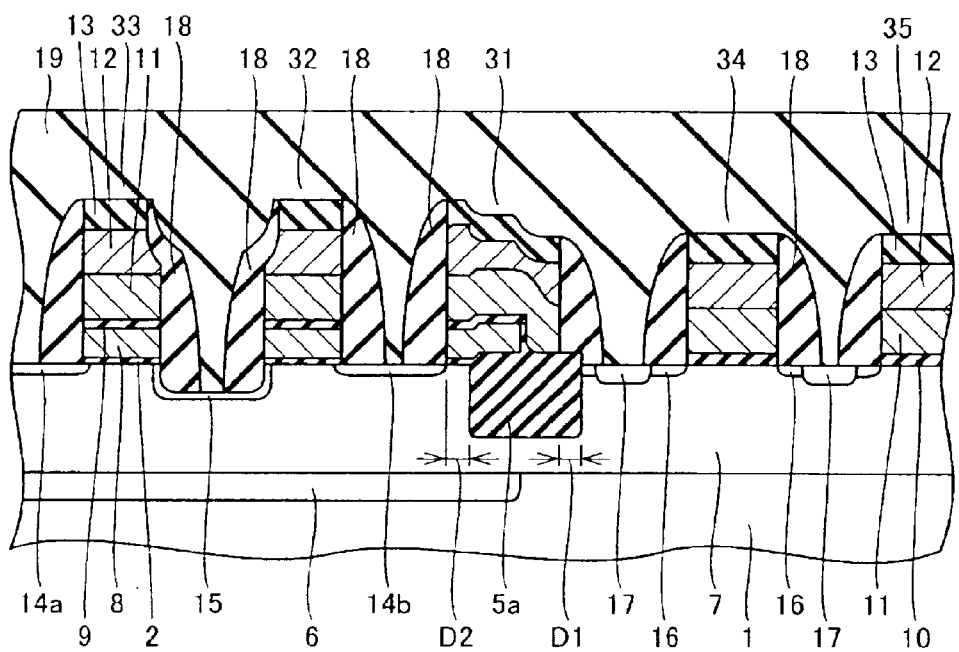
FIG. 26 is a cross-sectional view of the semiconductor device through a section line XXVI—XXVI in FIG. 27 according to a fifth embodiment of the present invention.
Figure 27:
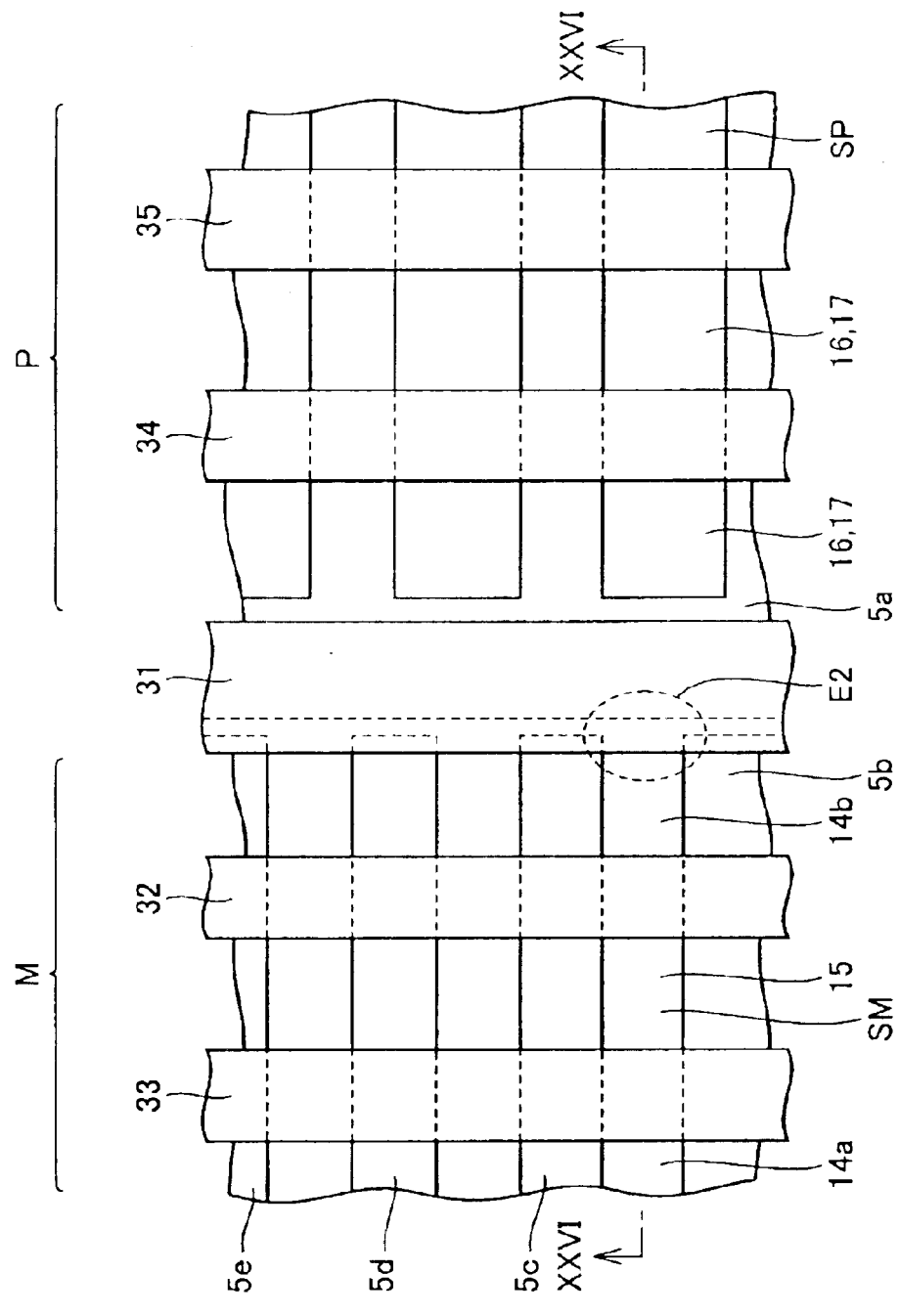
FIG. 27 is a plan view of the semiconductor device according to the fifth embodiment.

In the present semiconductor device, however, the element forming region is arranged so that such an end is not formed. Specifically, as shown in FIGS. 26 and 27, in memory cell region M, a plurality of element isolation insulating films 5b–5e are formed on the surface of the semiconductor substrate, each extending in one direction and distanced from each other.

Distanced from respective end of the plurality of element isolation insulating films 5b–5e, element isolation insulating film 5a having its end in a direction crossing the one direction is formed. Gate electrodes 32, 33 of the memory cell transistor are formed so as to cross portions of element forming region SM (main region) each sandwiched by the plurality of element isolation insulating film 5b–5e.

In peripheral circuitry region P, a plurality of element forming regions SP are formed partitioned by element isolation insulating film 5a. Gate electrodes 34, 35 of the transistor for peripheral circuitry are each formed so as to cross the plurality of element forming regions SP.

Dummy gate electrode 31 is formed on a portion of element isolation insulating film 5a electrically insulating element forming region SM and element forming regions SP. The end of dummy gate electrode 31 at memory cell region M side is positioned on element forming region SM in memory cell region M. The end thereof at peripheral circuitry region P side is positioned on element isolation insulating film 5a.

The rest of the arrangement of elements formed on semiconductor substrate 1 shown in FIG. 26 is similar to the semiconductor device described in FIG. 2, and thus identical members are indicated by the identical reference character and detailed description thereof is not repeated.

In the semiconductor device above, as has been described, since the position of each end of dummy gate electrode 31 is different from the position of each corresponding end of element isolation insulating film 5a, the stress will not be centered to the portion of semiconductor substrate 1 positioned close to element isolation insulating film 5a and the number of crystal defects therein decreases.

Further, in element forming region SM in memory cell region M, since each element isolation insulating film 5b–5e and element isolation insulating film 5a is distanced as indicated in dot frame E2 in FIG. 27, there is no end surrounded by the element isolation insulating film at three sides.

As a result, the stress resulting from the element isolation insulating film will not be centered to the portion corresponding to the end of the element forming region, contributing to decrease the number of crystal defects.

It should be noted that in this case, each main region of element forming region SM sandwiched by element isolation insulating films 5b–5e is electrically connected to each other since element isolation insulating films 5b–5e and element isolation insulating film 5a are distanced from each other.

Therefore, it is preferable to set a switching transistor including gate electrode 32 formed closest to dummy electrode 31 and a pair of impurity regions (drain region 14b, source region 15) to an off state constantly for electrically insulating each main region of element forming region SM.

Figure 28:
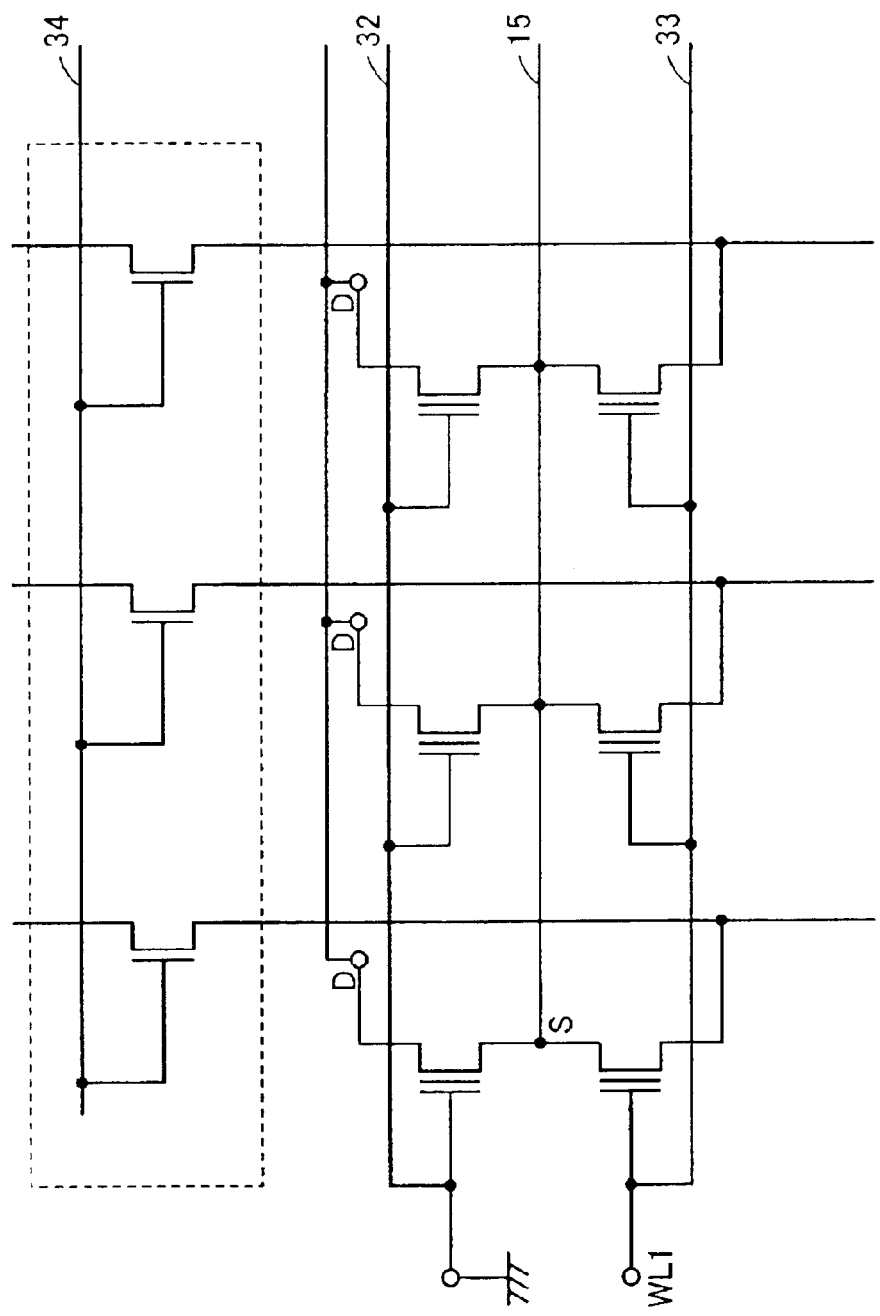
FIG. 28 shows an equivalent circuit of the semiconductor device according to the fifth embodiment.

An equivalent circuit diagram thereof is shown in FIG. 28. As shown in FIG. 28, in this case, drain region 14b and others formed in each main region of element forming region SM are electrically connected to each other. By setting the switching transistor to an off state constantly, each main region of element forming region SM can be electrically insulated from each other.

As a result, the memory cell transistors or the like that includes gate electrode 33, source region 15 and drain region 14a may not establish electrical short-circuit with each other, and desired function can be attained.

In the semiconductor device above, although the case where the end of dummy gate electrode 31 at memory cell region M side is positioned on the element forming region (main region) has been described as an example, it may be positioned on element isolation insulating film 5a. Further, although the end of dummy gate electrode 31 at peripheral circuitry region P side is positioned on element isolation insulating film 5a, it may be positioned on the element forming region in peripheral circuitry region P.

Sixth Embodiment

In each embodiment above, as represented by FIG. 1, the case where gate electrode 32 closest to dummy gate electrode 31 is specified as the dummy word line and the control electrode thereof is fixed to GND potential has been described.

Now, the variation of potential applied to gate electrode 32 for not causing the transistor including gate electrode 32 to turn on is described.

Figure 29:
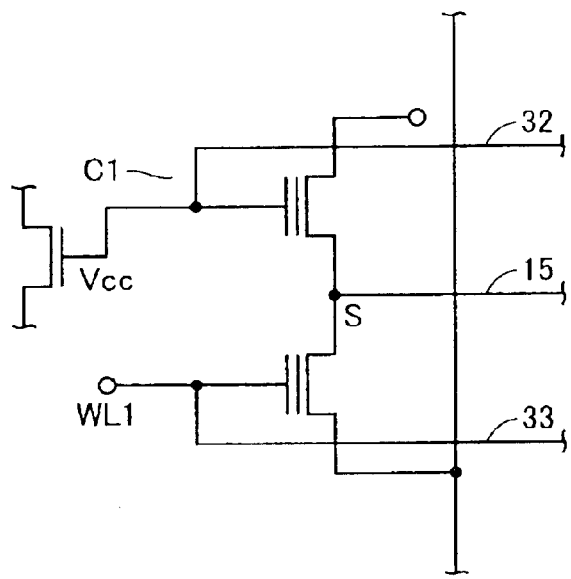
FIG. 29 shows an equivalent circuit in a first example of a semiconductor device according to a sixth embodiment of the present invention.
Figure 30:
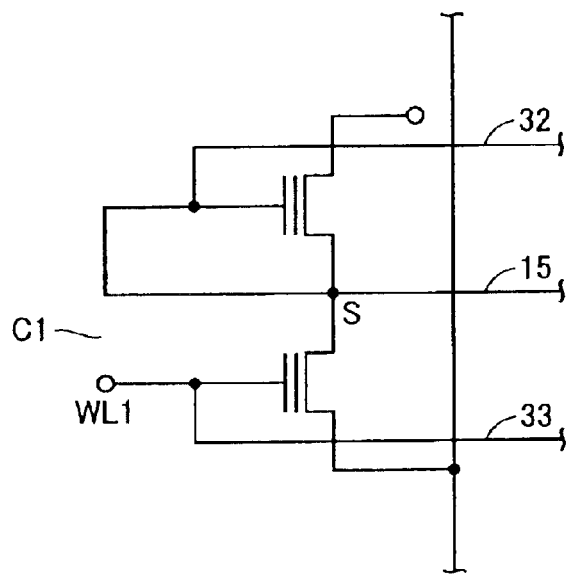
FIG. 30 shows an equivalent circuit in a second example of a semiconductor device according to the sixth embodiment.
Figure 31:
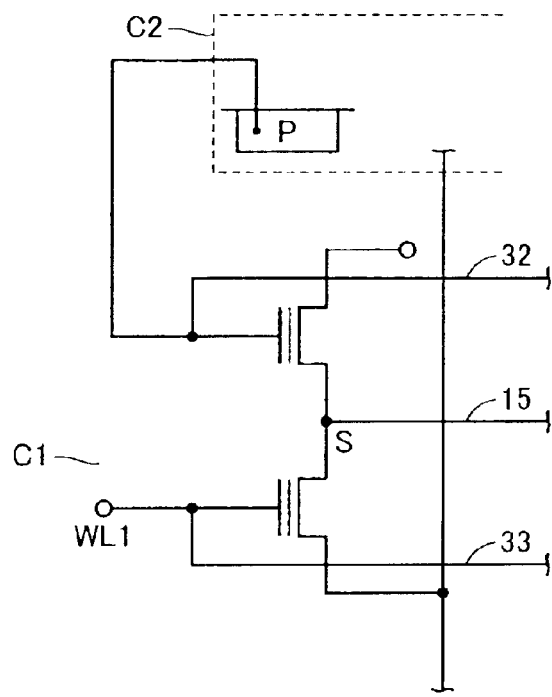
FIG. 31 shows an equivalent circuit in a third example of a semiconductor device according to the sixth embodiment.

First, as shown in FIG. 29, the control electrode of gate electrode 32 may be fixed to supply voltage Vcc. Additionally, as shown in FIG. 30, the control electrode of gate electrode 32 may be fixed to source potential. Further, as shown in FIG. 31, the control electrode of gate electrode 32 may be electrically connected to a p type well formed in the peripheral circuitry region.

The transistor may not be caused to turn on by fixing the control electrode in gate electrode 32 to each potential above as well. Hence, the end of the element forming region surrounded by element isolation insulating film 5a at three sides and the portions, except for that end, of element forming region in which large number of memory cell transistors can be electrically insulated from each other.

As a result, even when the stress is centered to the end due to its position being surrounded by element isolation insulating film at three sides, and crystal defects occurs therein, the current leakage through the crystal defects is suppressed, and desired function is attained without each memory cell transistor short-circuiting with each other.

In fixing the control electrode of the gate electrode, it is fixed to the potential of the well formed in the peripheral circuitry region since the potential of the well formed in the memory cell region fluctuates when operating the memory cell.

Further, alternative to fixing the control electrode of gate electrode 32 to a prescribed potential, the floating electrode of gate electrode 32 may be fixed to a prescribed potential. In the following, an example of such a semiconductor device is described.

Figure 32:
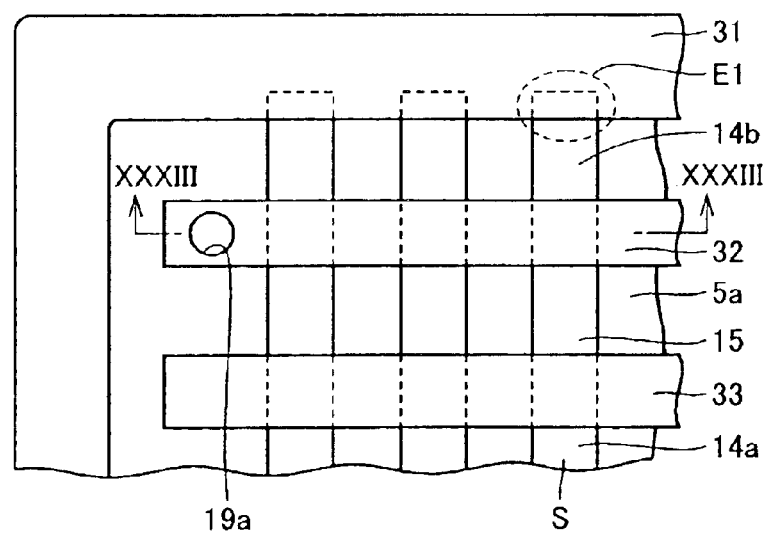
FIG. 32 is a partial plan view showing a fourth example of a semiconductor device according to the sixth embodiment.
Figure 33:
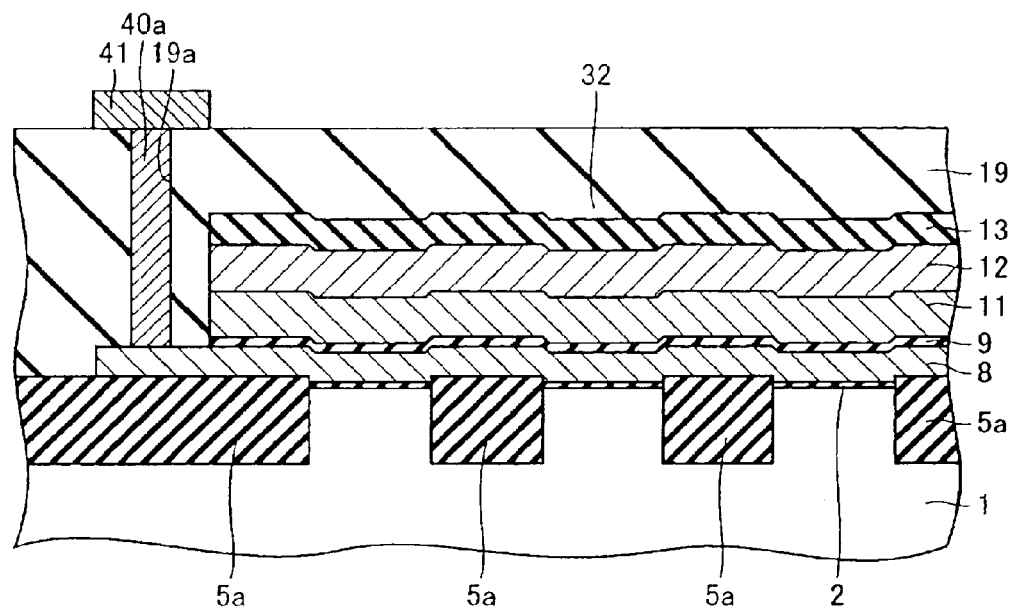
FIG. 33 is a cross-sectional view through a section line XXXIII—XXXIII in FIG. 32 according to the sixth embodiment.

As shown in FIGS. 32 and 33, a contact hole 19a is formed in interlayer oxide film 19 covering gate electrode 32 to expose a floating electrode 8 of gate electrode 32, and within contact hole 19a, a plug 40a electrically connected to floating electrode 8 is formed.

An interconnection 41 electrically connected to plug 40a is formed on interlayer oxide film 19. Interconnection 41 may be connected to supply voltage Vcc, or may be connected to GND.

Thus, floating electrode 8 of gate electrode 32 is fixed to supply voltage Vcc or ground potential to maintain the state in which the transistor including gate electrode 32 is not caused to turn on.

In should be noted that when fixing floating electrode 8 of gate electrode 32 to a prescribed potential, floating electrode 8 must be electrically connected along the direction to which control electrodes 11, 12 extend as shown in FIG. 33.

Further, both of the floating electrode and the control electrode of gate electrode 32 may be connected to a prescribed potential. In the following, an example of such an semiconductor device is described.

Figure 34:
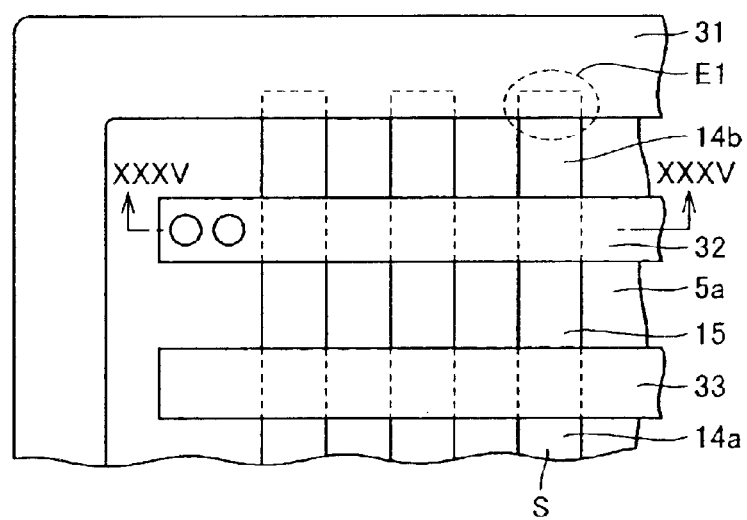
FIG. 34 is a partial plan view showing a fifth example of a semiconductor device according to the sixth embodiment.
Figure 35:
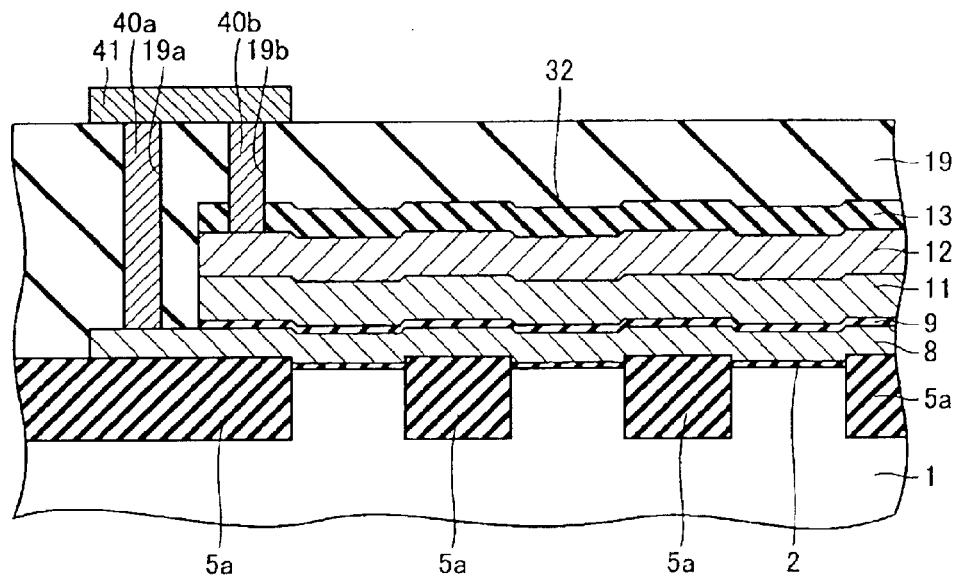
FIG. 35 is a cross-sectional view through a section line XXXV—XXXV in FIG. 34 according to the sixth embodiment.

As shown in FIGS. 34 and 35, a contact hole 19b exposing control electrodes 11, 12 of gate electrode 32 is formed in interlayer oxide film 19, in addition to contact hole 19a. Inside contact hole 19b, a plug 40b electrically connected to control electrodes 11, 12 is formed.

Interconnection 41 formed on interlayer oxide film 19 is electrically connected to both of plugs 40a and 40b. Interconnection 41 may be connected to supply voltage Vcc or may be connected to GND.

Hence, floating electrode 8 and control electrodes 11, 12 of gate electrode 32 can be fixed to supply voltage Vcc or ground potential for maintaining the state in which the transistor including gate electrode 32 is not caused to turn on.

It should be noted that, in a manufacturing process after the gate electrode is formed, holes may be accumulated in the floating electrode of the gate electrode due to an dry etching or a plasma process in removing resist, for example.

With holes accumulated in the floating electrode, even when a prescribed potential is applied to the floating electrode and/or control electrode, the channel region is depleted and thus a current flows. In other words, the transistor including dummy gate electrode 32 turns on.

Therefore, before actually operating the memory cell transistor, it is preferable to inject electrons only to the floating electrode of dummy gate electrode 32 by an appropriate writing operation or the like, for example.

Holes are neutralized by injected electrons, and a current flow due to the depletion of the channel region can be avoided. Thus, the state in which the transistor including dummy gate electrode is not caused to turn on can be maintained.

In each embodiment above, it is preferable to form gate electrodes 33, 34 and 35 including dummy gate electrodes 31, 32 at substantially regular intervals from each other.

Thus, since flatness is maintained between memory cell region M and peripheral circuitry region P after forming gate electrodes 31–35, the stability of the process can be attained.

The example of the two-layer structure gate electrode including the floating electrode and the control electrode as conductor portion has been described. A single-layer structure or three or more layer structure may be involved with the occurrence of crystal defects in element forming region as well, depending on the manufacturing method thereof.

In such cases also, by maintaining the positional relationship between conductor portion and the element isolation insulating film as above, the occurrence of crystal defects can be suppressed.

Further, the conductor portion is not limited to dummy gate electrode formed from the same layer as the gate electrode, and it may be formed from other conductive material.

In each embodiment above, although the flash memory has been described as an example of a semiconductor device, the present semiconductor device is not limited to the flash memory. For example, it can be widely applied to dynamic random access memory (DRAM), and a semiconductor device having an element forming region partitioned by an element isolation insulating film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a trench isolation insulating film region formed on a main surface of a semiconductor substrate and including a trench isolation insulating film;

a first element forming region and a second element forming region formed on first and second sides of the main surface of said semiconductor substrate with said trench isolation insulating film lying between the regions;

a memory cell formed in said first element forming region;

a transistor formed in said second element forming region; and a conductor portion formed on said trench isolation insulating film so as to overlap with said trench isolation insulating film in a plane; wherein said memory cell includes a first gate insulating film, a first gate electrode formed on said first gate insulating film and including a first conductive layer, a first insulating film formed on said first gate electrode, and a second gate electrode formed on said insulating film and including a second conductive layer, said transistor includes a second gate insulating film, and a third gate electrode formed on said second gate insulating film and including a third conductive layer, said conductor portion includes a first structure located on a side of said first element forming region and constituted of a fourth conductive layer, a second insulating film, and a fifth conductive layer, and a second structure located on a side of said second element forming region and integrally formed with said first structure from a sixth conductive layer, and a first end on a side of said first structure in said conductor portion and a second end on a side of said second structure in said conductor portion are formed such that at least one of a first positional relation and a second positional relation is established, the first positional relation being such that said first end is located within any one of said trench isolation insulating film region and said first element forming region, and the second positional relation being such that said second end is located within any one of said trench isolation insulating film region and said second element forming region.

2. The semiconductor device according to claim 1, wherein
said trench isolation insulating film extends in one direction,
a plurality of said first element forming regions are formed, each extending in a direction approximately perpendicular to said one direction, and
the plurality of said first element forming regions are partitioned by other trench isolation insulating film from each other.

3. The semiconductor device according to claim 1, wherein
a plurality of gate electrode portions including said first gate electrode, said insulating film, and said second gate electrode are formed in said first element forming region at prescribed intervals, and
a distance between a gate electrode closest to said conductor portion among the plurality of said gate electrode portions and said conductor portion is substantially the same as said prescribed interval.

4. The semiconductor device according to claim 1, wherein
a plurality of gate electrode portions including said first gate electrode, said first insulating film, and said second gate electrode are formed in said first element forming region at prescribed intervals, and
a gate electrode portion closest to said conductor portion among the plurality of said gate electrode portions is fixed to a prescribed potential not causing a transistor including said gate electrode to turn on.

5. The semiconductor device according to claim 4, wherein
said prescribed potential is applied to at least one of said first gate electrode and said second gate electrode of said gate electrode portion closest to said conductor portion.

6. The semiconductor device according to claim 1, wherein
said gate electrode portion including said first gate electrode, said insulating film, and said second gate electrode is at most 0.5 $\mu$m in height.

7. The semiconductor device according to claim 1, wherein
said first positional relation is such that said first end in said conductor portion is located within said first element forming region, and that a distance from a border between said first element forming region and said trench isolation insulating film to said first end is at least 0.1 $\mu$m.

8. The semiconductor device according to claim 1, wherein
said second positional relation is such that said second end in said conductor portion is located within said second element forming region, and that a distance from a border between said second element forming region and said trench isolation insulating film to said second end is at least 0.1 $\mu$m.

9. The semiconductor device according to claim 1, wherein
said first positional relation is such that said first end is located within said first element forming region, and that a distance from a border between said first element forming region and said trench isolation insulating film to said first end is at least 0.1 $\mu$m, and
said second positional relation is such that said second end is located within said second element forming region, and that a distance from a border between said second element forming region and said trench isolation insulating film to said second end is at least 0.1 $\mu$m.

10. The semiconductor device according to claim 1, wherein
a first distance from a border of said first element forming region and said trench isolation insulating film to said first end, and a second distance from a border of said second element forming region and said trench isolation insulating film to said second end are different.

11. The semiconductor device according to claim 1, wherein
said first conductive layer and said fourth conductive layer are substantially identical in a film thickness,
said second conductive layer, said third conductive layer, said fifth conductive layer, and said sixth conductive layer are substantially identical in a film thickness, and
said first insulating film and said second insulating film are substantially identical in a film thickness.

12. A semiconductor device, comprising:
a first element isolation insulating film and a second element isolation insulating film each extending in one direction on a main surface of a semiconductor substrate and formed distanced from each other;
a third element isolation insulating film formed on the main surface of said semiconductor substrate, distanced from respective end of said first element isolation insulating film and said second element isolation insulating film at said one direction side, and extending in a direction crossing said one direction;
an element forming region formed on the main surface of said semiconductor substrate and partitioned by said first element isolation insulating film, said second element isolation insulating film and said third element isolation insulating film;
a first electrode portion formed to cross a main region positioned in a region sandwiched by said first element isolation insulating film and said second element isolation insulating film in said element forming region, and extending in a direction crossing said one direction;
a second electrode portion formed to cross said main region of said element forming region, in an opposing side to said third element isolation insulating film relative to said first electrode portion so as to be distanced therefrom, and extending in a direction crossing said one direction; and
a prescribed plurality of impurity regions formed in a region except for the region to which said first electrode portion and said second electrode portion are positioned, in said main region of said element forming region, wherein
a switching element is formed by one pair of impurity regions among said plurality of impurity regions positioned in one side and other side of said main region so as to sandwich said first electrode portion, and said first electrode portion, and
said switching element is constantly in an off state.

13. The semiconductor device according to claim 12, further comprising:
a conductor portion formed on said third element isolation insulating film; wherein a position of a conductor portion end of said conductor portion at said element forming region side and a position of an isolation end of said third element isolation insulating film at said element forming region side are different.

14. The semiconductor device according to claim 12, wherein said first element isolation insulating film, said second element isolation insulating film, and said third element isolation insulating film serve as trench isolation insulating film, said semiconductor device further comprises a conductor portion formed on said third element isolation insulating film, said first electrode portion includes a lower gate electrode including a first conductive layer, a first insulating film formed on said lower gate electrode, and an upper gate electrode formed on said insulating film and including a second conductive layer, said second electrode portion includes a gate electrode formed by said third conductive layer, and said conductor portion includes a first structure formed of a fourth conductive layer, a second insulating film, and a fifth conductive layer on a side of said first electrode portion, and a second structure integrally formed with said first structure from a sixth conductive layer on a side opposite to the side where said first electrode portion in said first structure is located.

15. The semiconductor device according to claim 14, wherein said first conductive, layer and said fourth conductive layer are substantially identical in a film thickness, said second conductive layer, said third conductive layer, said fifth conductive layer, and said sixth conductive layer are substantially identical in a film thickness, and said first insulating film and said second insulating film are substantially identical in a film thickness.

16. The semiconductor device according to claim 12, wherein said third element isolation insulating film serves as trench isolation insulating film, said semiconductor device further comprises a conductor portion formed on said third element isolation insulating film, said first electrode portion includes a first gate insulating film, a lower gate electrode formed on said first gate insulating film and including a first conductive layer, and an upper gate electrode formed on said lower gate electrode and including a second conductive layer, said second electrode portion includes a second gate insulating film having a film thickness different from that of said first gate insulating film, and a gate electrode formed on said second gate insulating film and including a third conductive layer, and said conductor portion includes a first structure formed of a third insulating film, a fourth conductive layer, and a fifth conductive layer on a side of said first electrode portion, and a second structure integrally formed with said first structure from a fourth gate insulating film and a sixth conductive layer on a side opposite to the side where said first electrode portion in said first structure is located.

17. The semiconductor device according to claim 16, wherein said first conductive layer and said fourth conductive layer are substantially identical in a film thickness, said second conductive layer, said third conductive layer, said fifth conductive layer, and said sixth conductive layer are substantially identical in a film thickness, said first insulating film and said third insulating film are substantially identical in a film thickness, and said second insulating film and said fourth insulating film are substantially identical in a film thickness.

18. A semiconductor device, comprising:

a trench isolation insulating film region formed on a main surface of a semiconductor substrate and including a trench isolation insulating film;

a first element forming region and a second element forming region formed on first and second sides of the main surface of said semiconductor substrate with said trench isolation insulating film lying between the regions;

a memory cell formed in said first element forming region;

a transistor formed in said second element forming region; and a conductor portion formed on said trench isolation insulating film so as to overlap with said trench isolation insulating film in a plane; wherein said memory cell includes a first gate insulating film, a lower gate electrode formed on said first gate insulating film and including a first conductive layer, and an upper gate electrode formed on said lower gate electrode and including a second conductive layer, said transistor includes a second gate insulating film having a film thickness different from that of said first gate insulating film, and a gate electrode formed on said second gate insulating film and including a third conductive layer, said conductor portion includes a first structure located on a side of said first element forming region and constituted of a third gate insulating film, a fourth conductive layer, and a fifth conductive layer, and a second structure located on a side of said second element forming region and integrally formed with said first structure from a fourth gate insulating film and a sixth conductive layer, and a first end on a side of said first structure in said conductor portion and a second end on a side of said second structure in said conductor portion are formed such that at least one of a first positional relation and a second positional relation is established, the first positional relation being such that said first end is located within any one of said trench isolation insulating film region and said first element forming region, and the second positional relation being such that said second end is located within any one of said trench isolation insulating film region and said second element forming region.

19. The semiconductor device according to claim 18, wherein said first positional relation is such that said first end in said conductor portion is located within said first element forming region, and that a distance from a border between said first element forming region and said trench isolation insulating film to said first end is at least 0.1 μm.

20. The semiconductor device according to claim 18, wherein said second positional relation is such that said second end in said conductor portion is located within said second element forming region, and that a distance from a border between said second element forming region and said trench isolation insulating film to said second end is at least 0.1 μm.

21. The semiconductor device according to claim 18, wherein said first positional relation is such that said first end is located within said first element forming region, and that a distance from a border between said first element forming region and said trench isolation insulating film to said first end is at least 0.1 μm, and said second positional relation is such that said second end is located within said second element forming region, and that a distance from a border between said second element forming region and said trench isolation insulating film to said second end is at least 0.1 μm.

22. The semiconductor device according to claim 18, wherein a first distance from a border of said first element forming region and said trench isolation insulating film to said first end, and a second distance from a border of said second element forming region and said trench isolation insulating film to said second end are different.

23. The semiconductor device according to claim 18, wherein said first conductive layer and said fourth conductive layer are substantially identical in a film thickness, said second conductive layer, said third conductive layer, said fifth conductive layer, and said sixth conductive layer are substantially identical in a film thickness, said first insulating film and said third insulating film are substantially identical in a film thickness, and said second insulating film and said fourth insulating film are substantially identical in a film thickness.

\* \* \* \* \*